(12) United States Patent
Bräysy et al.

(10) Patent No.: US 12,232,267 B2
(45) Date of Patent: Feb. 18, 2025

(54) ELECTRONICS ASSEMBLY

(71) Applicant: TactoTek Oy, Oulunsalo (FI)

(72) Inventors: Vinski Bräysy, Oulunsalo (FI); Ilpo Hänninen, Oulunsalo (FI); Pälvi Apilo, Oulunsalo (FI); Mikko Heikkinen, Oulunsalo (FI); Topi Wuori, Oulunsalo (FI); Mikko Sippari, Oulunsalo (FI); Heikki Alamäki, Oulunsalo (FI)

(73) Assignee: TACTOTEK OY, Oulunsalo (FI)

( * ) Notice: Subject to any disclaimer, the term of this patent is extended or adjusted under 35 U.S.C. 154(b) by 0 days.

(21) Appl. No.: 18/609,232

(22) Filed: Mar. 19, 2024

(65) Prior Publication Data

US 2024/0237218 A1    Jul. 11, 2024

Related U.S. Application Data

(63) Continuation of application No. 18/353,143, filed on Jul. 17, 2023, now Pat. No. 11,950,367, which is a continuation of application No. 17/704,264, filed on Mar. 25, 2022, now Pat. No. 11,910,530.

(51) Int. Cl.
*H05K 1/18* (2006.01)
*H05K 1/11* (2006.01)
(Continued)

(52) U.S. Cl.
CPC ............. *H05K 1/181* (2013.01); *H05K 1/111* (2013.01); *H05K 1/144* (2013.01); *H05K 3/12* (2013.01);
(Continued)

(58) Field of Classification Search
CPC .... H05K 1/11; H05K 1/111–114; H05K 1/14; H05K 1/141–144; H05K 1/18;
(Continued)

(56) References Cited

U.S. PATENT DOCUMENTS

| 5,864,092 A | 1/1999 | Gore et al. |
| 6,232,655 B1 | 5/2001 | Sugimura |

(Continued)

FOREIGN PATENT DOCUMENTS

| EP | 3547357 A1 | 10/2019 |
| JP | H10209189 A | 8/1998 |
| JP | 2002158509 A | 5/2002 |

*Primary Examiner* — Tuan T Dinh
(74) *Attorney, Agent, or Firm* — Robert P. Michal, Esq.; Carter, DeLuca & Farrell LLP

(57) ABSTRACT

An electronics assembly, includes obtaining or producing an electronics module, which includes a first circuitry on a first surface at a first side of a circuit board, at least one electronics component on the circuit board in electrical connection with the first circuitry, and at least one first connection portion on the first surface and/or an adjacent side surface at a peripheral portion of the circuit board, wherein the at least one first connection portion is electrically connected to or comprised in the first circuitry. The electronics assembly further includes arranging the electronics module on a second substrate including a second connection portion connected to a second circuitry on a surface of the second substrate and arranging electrically conductive joint material onto the first and second connection portions to extend between them for electrically connecting the electronics module to the second circuitry.

2 Claims, 11 Drawing Sheets

(51) Int. Cl.
*H05K 1/14* (2006.01)
*H05K 3/12* (2006.01)
*H05K 3/30* (2006.01)
*H05K 3/32* (2006.01)

(52) U.S. Cl.
CPC ............. *H05K 3/305* (2013.01); *H05K 3/321* (2013.01); *H05K 2201/0129* (2013.01)

(58) Field of Classification Search
CPC .. H05K 1/181–187; H05K 3/12; H05K 3/305; H05K 3/321; H05K 3/32; H05K 3/4617; H05K 3/4697; H05K 3/4691; H01L 23/498–552; Y10T 29/126; Y10T 29/128; Y10T 29/4913; Y10T 29/49155
USPC ......... 361/760–784, 790–795; 257/660–690, 257/730, 787–790; 29/830–846
See application file for complete search history.

(56) References Cited

U.S. PATENT DOCUMENTS

| | | | |
|---|---|---|---|
| 6,841,418 B2 | 1/2005 | Jeung et al. | |
| 7,358,115 B2* | 4/2008 | Karnezos | H01L 21/563 257/E23.114 |
| 7,821,346 B2 | 10/2010 | McCracken | |
| 8,476,656 B2* | 7/2013 | Kadotani | H01L 33/642 257/E23.101 |
| 8,587,021 B2* | 11/2013 | Hoetzl | F21V 23/005 257/99 |
| 8,664,538 B2* | 3/2014 | Kim | H01L 21/4846 29/832 |
| 8,723,337 B2* | 5/2014 | Howard | H01L 23/66 257/784 |
| 8,965,149 B2* | 2/2015 | Uemura | G02B 6/43 385/14 |
| 9,220,172 B2 | 12/2015 | Tsuduki et al. | |
| 11,935,806 B2* | 3/2024 | Miyata | H01L 23/367 |
| 2006/0043556 A1* | 3/2006 | Su | H01L 25/03 257/E25.011 |
| 2008/0116981 A1* | 5/2008 | Jacobson | H05K 1/0243 331/74 |
| 2010/0320601 A1* | 12/2010 | Pagaila | H01L 29/0657 257/E23.116 |
| 2014/0294342 A1* | 10/2014 | Offrein | G02B 6/4214 385/14 |
| 2016/0116688 A1* | 4/2016 | Hochberg | G02B 6/4232 385/14 |
| 2019/0042030 A1 | 2/2019 | Saaski et al. | |
| 2020/0229296 A1* | 7/2020 | Keränen | H05K 1/181 |

* cited by examiner

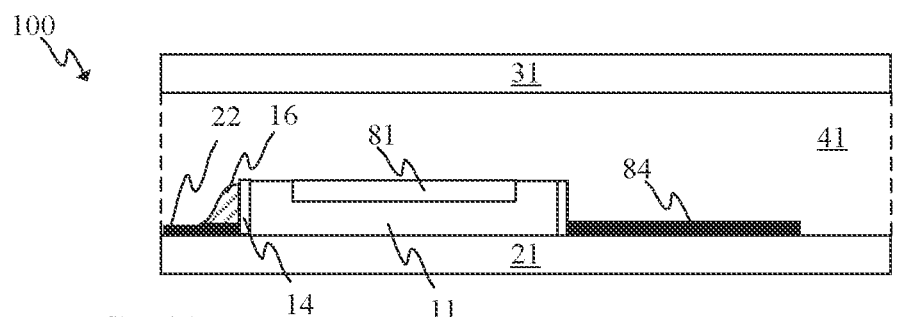
FIG. 11A
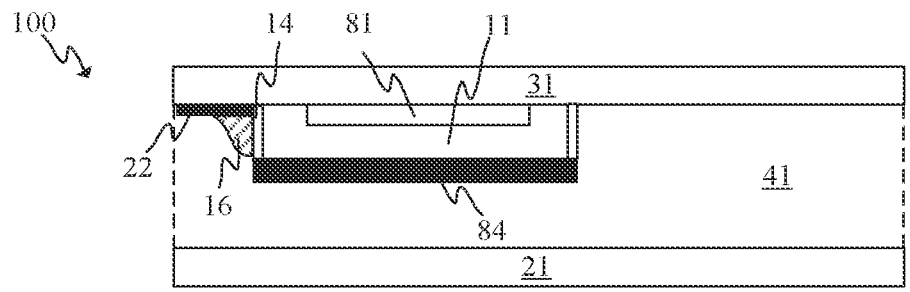
FIG. 11B
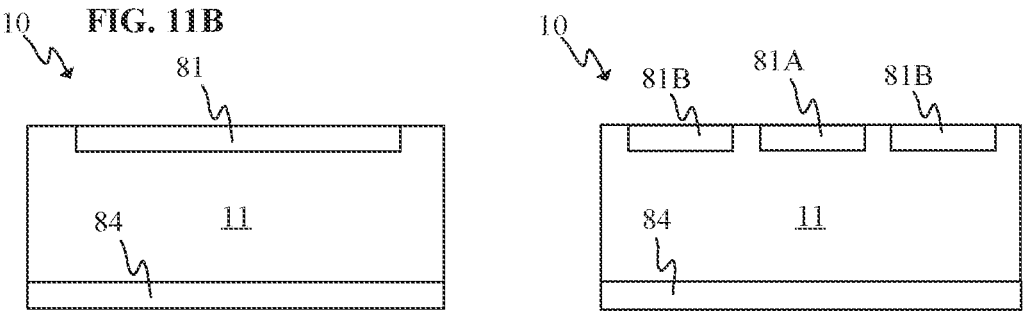
FIG. 11C
FIG. 11D
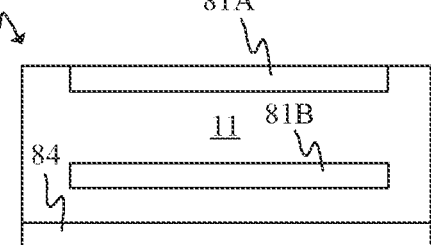
FIG. 11E
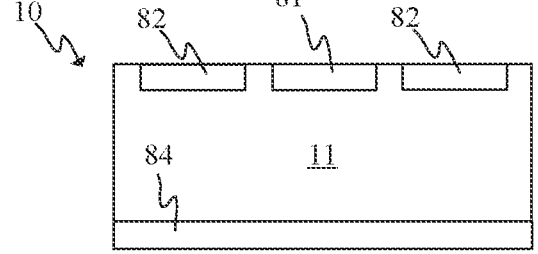
FIG. 11F
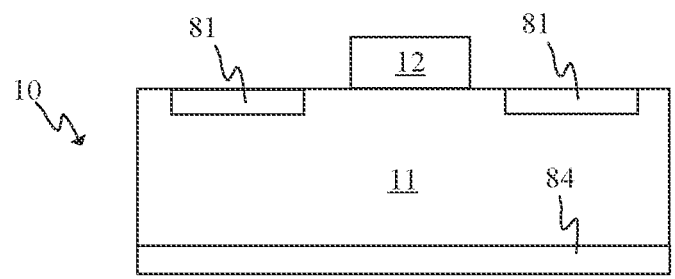
FIG. 11G

ELECTRONICS ASSEMBLY

CROSS-REFERENCE TO RELATED APPLICATIONS

This application is a continuation of U.S. patent application Ser. No. 18/353,143 filed Jul. 17, 2023 which is a continuation of U.S. patent application Ser. No. 17/704,264 filed Mar. 25, 2022, the disclosure of each of these applications is expressly incorporated herein by reference in their entirety.

FIELD OF THE INVENTION

The present invention relates in general to functional, integrated structures or electronics assemblies incorporating various functional features such as electronic, mechanical or optical elements. In particular, however not exclusively, the present invention concerns connecting electronic modules or sub-assemblies to substrates for producing such structures or assemblies.

BACKGROUND

There exists a variety of different stacked assemblies and multilayer structures in the context of different functional ensembles e.g. in the field of electronics and electronic products. The motivation behind the integration of functionalities involving e.g. electronics, mechanical or optical features may be as diverse as the related use contexts. Relatively often size savings, weight savings, cost savings, or just efficient integration of components is sought for when the resulting solution ultimately exhibits a multilayer nature. In turn, the associated use scenarios may relate to product packages or casings, visual design of device housings, wearable electronics, personal electronic devices, displays, detectors or sensors, vehicle interiors, antennae, labels, vehicle electronics, etc.

Electronics such as electronic components, ICs (integrated circuit), and conductors, may be generally provided onto a substrate element by a plurality of different techniques. For example, ready-made electronics such as various surface mount devices (SMD) may be mounted on a substrate surface that ultimately forms an inner or outer interface layer of a multilayer structure. Additionally, technologies falling under the term "printed electronics" may be applied to actually produce electronics directly and additively to the associated substrate. The term "printed" refers in this context to various printing techniques capable of producing electronics/electrical elements from the printed matter, including but not limited to screen printing, flexography, and inkjet printing, through a substantially additive printing process. The used substrates may be flexible and printed materials organic, which is however, not always the case.

Furthermore, the concept of injection molded structural electronics (IMSE) involves building functional devices and parts therefor in the form of a multilayer structure or assembly, which encapsulates electronic functionality as seamlessly as possible. Characteristic to IMSE is also that the electronics is commonly manufactured into a true 3D (non-planar) form in accordance with the 3D models of the overall target product, part or generally design. To achieve desired 3D layout of electronics on a 3D substrate and in the associated end product, the electronics may be still provided on an initially planar substrate, such as a film, using two dimensional (2D) methods of electronics assembly, whereupon the substrate, already accommodating the electronics, may be formed into a desired three-dimensional, i.e. 3D, shape and subjected to overmolding, for example, by suitable plastic material that covers and embeds the underlying elements such as electronics, thus protecting and potentially hiding the elements from the environment. Further layers and elements may be naturally added to the construction.

In many cases, there have been difficulties in obtaining robust functional, integrated structures, or assemblies, in which both mechanical and especially electrical connections, as well as other functionalities, operate reliably while still achieving cost-effective solutions. Typically, the connections are made by attaching the components and/or sub-assemblies to the substrate from below, that is, between the components and/or sub-assemblies and the substrate to which they are connected. The electrical connection means, such as connectors and/or pads or the like, used for connecting are arranged to be "under" the components and/or sub-assemblies which can result in a complex, laborious, and costly way of producing the assembly.

SUMMARY

The objective of the present invention is to at least alleviate one or more of the above drawbacks associated with the known solutions in the context of integral electronics assemblies including electronics modules or sub-assemblies, and especially connections thereof.

The objectives of the invention are reached by a method for manufacturing an electronics assembly and an electronic assembly as defined by the respective independent claims.

According to a first aspect, a method for manufacturing an electronics assembly is provided. The method comprises obtaining or producing an electronics module, wherein the electronics module comprises a first circuitry on a first surface at a first side of a circuit board, at least one electronics component on the circuit board and in electrical connection with the first circuitry, and at least one first connection portion on the first surface and/or an adjacent side surface at a peripheral portion of the circuit board, wherein the at least one first connection portion is electrically connected to or is comprised in the first circuitry. The method further comprises arranging the electronics module on a second substrate, such as on a thermoformable film or sheet, preferably of plastic material, comprising a second connection portion connected to a second circuitry on a surface of the second substrate, wherein a second surface of the circuit board, being on the opposite second side than the first surface, faces the second substrate. Still further, the method comprises arranging electrically conductive joint material onto the first and the second connection portions to extend between them for electrically connecting the electronics module to the second circuitry via the electrically conductive joint material.

The circuit board, or at least a portion thereof, may be one selected from the group consisting of: a printed circuit board (PCB), an, optionally low temperature, co-fired ceramic circuit board, an FR4 circuit board, a flexible PCB, a rigid-flex PCB.

In many embodiments, the circuit board may be rigid or at least the portion may be rigid, such as a PCB, an, optionally low temperature, co-fired ceramic circuit board, an FR4 circuit board.

The electrically conductive joint material may be one selected from the group consisting of: solder material, such as melted or stencil printed solder, conductive adhesive, conductive ink, conductive tape or film, for example, asymmetric conductive tape or film, or anisotropic conductive film (ACF).

In various embodiments, the electrically conductive joint material may be at least initially dispensable, preferably flowable, such as conductive adhesive or ink, or melted or stencil printed solder material, and the arranging of the electrically conductive joint material may comprise dispensing the electrically conductive joint material on the first and the second connection portions.

In various embodiments, the first connection portion may comprise one or a plurality of conductive pads at the peripheral portion on the first surface at the first side of the circuit board.

Alternatively or in addition, the first connection portion may include one or several castellated or plated edges or half-holes.

Furthermore, the first connection portion may comprise one or several vias or plated holes.

In various embodiments, the arranging of the electronics module may comprise attaching the electronics module to the second substrate by a second adhesive, preferably an electrically non-conductive adhesive, provided on the second side of the electronics module.

In various embodiments, the method may comprise applying a conformal coating, an encapsulant or glob top layer onto the first surface to embed at least the at least one electronics component.

Furthermore, the method may comprise forming, such as thermoforming, the second substrate at least locally from a planar shape to exhibit a non-planar or 3D shape, such as a convex and/or concave surface portion, prior to or after the arranging of the electronics module on the second substrate. The forming of the second substrate may, preferably, however, not necessarily, occur after the arranging of the electronics module on the second substrate. In some embodiments, the forming may occur prior to said arranging.

The method may, in some embodiments, comprise providing a trench, such as including or being a depression or an indentation, to the second substrate, the trench having a shape and a lateral size such that the electronics module fits laterally into the trench. Furthermore, the trench may be provided by thermoforming the second substrate.

In various embodiments, the circuit board may comprise a rigid portion and a flex portion attached to each other, wherein the at least one first connection portion is comprised in the peripheral portion of the flex portion.

In some embodiments, the at least one electronics component may be a connector for providing electrical connection between an external entity and the first circuitry.

Still further, the method may comprise arranging a third substrate, such as on a thermoformable film or sheet, preferably of plastic material, on the opposite side of the electronics module relative to the second substrate.

Furthermore, the method may comprise forming, such as thermoforming, the third substrate, alternatively or in addition to the forming of the second substrate, at least locally from a planar shape to exhibit a non-planar or 3D shape, such as a convex and/or concave surface portion, prior to or after the provision of the molded material layer. Thus, the molded material layer may be provided first on the second substrate and then the third substrate is provided onto the molded material layer, or the molded material layer may be provided between the second and the third substrates.

Furthermore, in some embodiments, the at least one electronics component may be a segment display, such as a 7-segment, 8-segment, or 16-segment display.

Furthermore, the third substrate may be attached to the first surface of the circuit board and/or the at least one electronics component by third adhesive, such as transparent adhesive or film.

Alternatively or in addition, the method may comprise removing a portion of the second substrate to expose the circuit board for arranging the at least one electronics component on the exposed portion of the second surface.

Furthermore, the third substrate may be attached to the first surface of the circuit board by third adhesive, such as anisotropic conductive adhesive or film.

In an embodiment, the method may comprise arranging a display to a space left by the removed portion of the third substrate.

The circuit board may comprise a cavity on the first surface, and the method may then comprise removing a portion of the third substrate to expose the cavity for arranging one or several electronics components, such as a passive infrared sensor, to the cavity.

In some embodiments, the method may comprise attaching a second circuit board to the third substrate on the side facing or to be facing the electronics module, wherein the second circuit board comprises a through-hole, and removing a portion of the third substrate to expose the through-hole for arranging one or several electronics components, such as a passive infrared sensor, to a cavity defined by the through-hole and the circuit board.

In various embodiments, the method may comprise molding, preferably injection molding, material, such as thermoplastic material, onto a side of the second substrate having the electronics module and at least partly embedding the electronics module.

The method may also comprise removing a portion of the second substrate after the arranging of the electronics module so as to expose at least partly the electronics module on the opposite side thereof relative to the at least one electronics component.

In some embodiments, the at least one electronics component may include one or more capacitive sensing elements, such as electrodes. Furthermore, the electronics module may comprise a ground layer on the opposite side thereof relative to the one or more capacitive sensing elements.

In some other embodiments, the at least one electronics component may include one or more inductive sensors or force or pressure sensing elements.

In various embodiments, the method may comprise arranging a protective ring onto the circuit board and around the at least one electronics component, the protective ring optionally comprising a cover on the opposite side relative to the circuit board. Furthermore, the circuit board may comprise an antenna element, such as a printed antenna or a ceramic antenna.

Alternatively or in addition, the method may comprise providing potting material into a space defined by the protective ring and the circuit board, and optionally the cover.

In various embodiments, the protective ring may be a reflector or comprise reflective inner surface.

Alternatively or in addition, the cover may be a diffuser, such as being made of diffuse material.

The electronics module may further comprise, in various embodiments, an electrical energy storage, such as a battery.

In an embodiment, the method may comprise arranging a gas sensor onto the circuit board, and providing a gas vent in fluid communication with the gas sensor by removing a portion of the third substrate.

In an embodiment, the method may comprise arranging an audio device on the circuit board. Alternatively, the method may comprise arranging a haptic actuator like linear resonance actuator (LRA) or eccentric resonance motor (ERM).

According to a second aspect, an electronics assembly is provided. The electronics assembly comprises a second substrate, such as a thermoformable film or sheet, preferably of plastic material, comprising a second connection portion connected to a second circuitry on a surface of the second substrate. The electronics assembly also comprises an electronics module, wherein the electronics module comprises: a first circuitry on a first surface at a first side of a circuit board, at least one electronics component on the circuit board and in electrical connection with the first circuitry, and at least one first connection portion on the first surface and/or an adjacent side surface at a peripheral portion of the circuit board, wherein the at least one first connection portion is electrically connected to or is comprised in the first circuitry. A second surface of the circuit board, being on the opposite second side than the first surface, faces the second substrate. Furthermore, the electronics assembly comprises electrically conductive joint material, such as one selected from the group consisting of: solder material, melted or stencil printed solder, conductive adhesive, conductive ink, conductive tape, arranged onto the first and the second connection portions to extend between them to electrically connect the electronics module to the second circuitry via the electrically conductive joint material.

The electronics assembly may, preferably, comprise a molded, such as injection molded, material layer embedding the electronics module.

The molded material layer may, in general, comprise, for example, at least one material selected from the group consisting of: polymer, organic material, biomaterial, composite material, thermoplastic material, thermosetting material, elastomeric resin, PC, PMMA, ABS, PET, copolyester, copolyester resin, nylon (PA, polyamide), PP (polypropylene), TPU (thermoplastic polyurethane), polystyrene (GPPS), TPSiV (thermoplastic silicone vulcanizate), and MS resin. The molded material layer may be transparent, translucent, or opaque.

The electronics assembly may, preferably, comprise a third substrate on the opposite side of the electronics module relative to the second substrate. The molded material layer may, thus, be arranged between the third substrate and the second substrate.

In some embodiments, there may be no molded material at the position of the electronics module since the electronics module extends from the second substrate to be in contact with the third substrate or at least some layer in contact with the third substrate, being other than the molded material layer.

The at least one electronics component may comprise at least one component selected from the group consisting of: a microcontroller, an integrated circuit, a transistor, a resistor, a capacitor, an inductor, a diode, a photodiode, a light-emitting diode, a semiconductor switch, electromechanical component, electro-optical component, radiation-emitting component, light-emitting component, LED (light-emitting diode), OLED (organic LED), side-shooting LED or other light source, top-shooting LED or other light source, bottom-shooting LED or other light source, radiation detecting component, light-detecting or light-sensitive component, photodiode, phototransistor, photovoltaic device, sensor, micromechanical component, switch, touch switch, touch panel, proximity switch, touch sensor, atmospheric sensor, temperature sensor, pressure sensor, moisture sensor, gas sensor, proximity sensor, capacitive switch, capacitive sensor, projected capacitive sensor or switch, single-electrode capacitive switch or sensor, capacitive button, multi-electrode capacitive switch or sensor, self-capacitance sensor, mutual capacitive sensor, inductive sensor, sensor electrode, micromechanical component, UI element, user input element, vibration element, sound producing element, communication element, transmitter, receiver, transceiver, antenna, infrared (IR) receiver or transmitter, wireless communication element, wireless tag, radio tag, tag reader, data processing element, microprocessor, microcontroller, digital signal processor, signal processor, programmable logic chip, ASIC (application-specific integrated circuit), data storage element, and electronic sub-assembly.

In various embodiments, possible additional layers or generally features, may be added into the electronics assembly by molding, lamination or suitable coating (e.g. deposition) procedure not forgetting other possible positioning or fixing techniques. The layers may be of protective, indicative and/or aesthetic value (graphics, colors, figures, text, numeric data, etc.) and contain e.g. textile, leather or rubber materials instead of or in addition to further plastics. Additional elements such as electronics, modules, module internals or parts, and/or optics may be installed and fixed e.g. at the outer surface(s) of the structure, such as the exterior surface of an included film or a molded layer depending on the embodiment. Necessary material shaping/cutting may take place. For example, a diffuser may be produced from locally lasering lightguide material. If provided with a connector, the connector of the multilayer structure may be connected to a desired external connecting element such as an external connector of an external device, system or structure, e.g. a host device. For example, these two connectors may together form a plug-and-socket type connection and interface. The multilayer structure may also be generally positioned and attached herein to a larger ensemble such as an electronic device such as a personal communications device, computer, household apparatus, industrial device, or e.g. a vehicle in embodiments wherein the multilayer structure establishes a part of vehicle exterior or interior, such as a dashboard.

The present invention provides a method for manufacturing an electronics assembly and an electronics assembly. The present invention provides advantages over known solutions in that the electronics module can be attached directly to film since only mechanical attachment have to used, if any, between the module and the film. Such bonding can be made strong and this allows to place module even directly under injection molding gate in case there is injection molded material being applied to embed the module. The direct attachment also makes thermal path to surface of the part shorter allowing better heat dissipation and more power per module. The electrical connection can then be established via the edge and or top of the module. Thus, the best properties for both the mechanical and electrical connections can be obtained resulting in overall more robust and cost-effective structure.

In many cases, the electrical connections may be done with a conductive adhesive or ink. These can be dispensed so that it also covers part of pad on circuit board. For example, by using single ink, different materials used in assembly can be minimized if the contact pads and/or traces have been made of the same ink, thus making the assembly more reliable and easier to adapt for, for example, functional safety requirements.

Various other advantages will become clear to a skilled person based on the following detailed description.

The expression "a number of" may herein refer to any positive integer starting from one (1), that is being one, at least one, or several.

The expression "a plurality of" may refer to any positive integer starting from two (2), that is being two, at least two, or any integer higher than two.

The terms "first", "second" and "third" are herein used to distinguish one element from other element, and not to specially prioritize or order them, if not otherwise explicitly stated.

The exemplary embodiments of the present invention presented herein are not to be interpreted to pose limitations to the applicability of the appended claims. The verb "to comprise" is used herein as an open limitation that does not exclude the existence of also unrecited features. The features recited in the dependent claims are mutually freely combinable unless otherwise explicitly stated.

The novel features which are considered as characteristic of the present invention are set forth in particular in the appended claims. The present invention itself, however, both as to its construction and its method of operation, together with additional objectives and advantages thereof, will be best understood from the following description of specific embodiments when read in connection with the accompanying drawings.

BRIEF DESCRIPTION OF FIGURES

Some embodiments of the invention are illustrated by way of example, and not by way of limitation, in the figures of the accompanying drawings.

FIGS. 11A and 11B illustrate schematically an electronics assembly.
FIGS. 11C, 11D, 11E, 11F and 11G illustrate schematically electronics modules.

DETAILED DESCRIPTION OF SOME EMBODIMENTS

Figure 1:
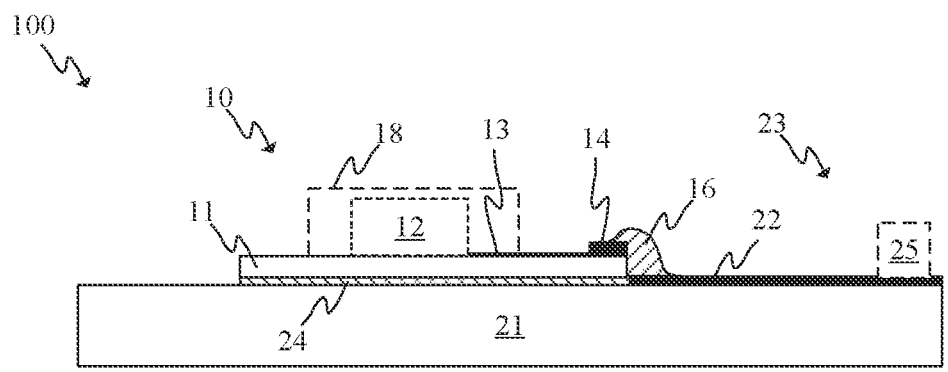
FIG. 1 illustrates schematically an electronics assembly.

FIG. 1 illustrates schematically an electronics assembly 100. The electronics assembly 100 may comprise a second substrate 21, such as a thermoformable film or sheet, preferably of plastic material, comprising a second connection portion 22 connected to or being comprised in a second circuitry 23 on a surface of the second substrate 21. The second circuitry 23 may also comprise active and/or passive electronics components, electromechanical components, optical components, semiconductor devices, as well as conductive pads, traces, etc.

Furthermore, the electronics assembly 100 may comprise an electronics module 10. The electronics module may comprise a first circuitry 13 on a first surface at a first side of a circuit board 11, at least one electronics component 12 on the circuit board 11 and in electrical connection with the first circuitry 13, and at least one first connection portion 14 on the first surface and/or an adjacent side surface at a peripheral portion of the circuit board 11, wherein the at least one first connection portion 14 is electrically connected to or is comprised in the first circuitry 13. Still further, a second surface of the circuit board 11, being on the opposite second side than the first surface, faces the second substrate 21, as is visible in FIG. 1.

The electronics assembly 100 also comprises electrically conductive joint material 16, such as one selected from the group consisting of solder material, conductive adhesive, conductive ink, and conductive tape, arranged onto the at least one first connection portion 14 and the second connection portions 22 to extend between them to electrically connect the electronics module 10 to the second circuitry 23 via the electrically conductive joint material 16.

In FIG. 1, the electrically conductive joint material 16 is illustrated as being at least initially dispensable, preferably flowable, such as conductive adhesive or ink, or melted or stencil printable solder material. However, instead of such materials, for example a conductive tape can be utilized to extend between the at least one first connection portion 14 and the second connection portions 22 to provide electrical connection via the tape.

As can be seen in FIG. 1, the at least one first connection portion 14 may be arranged on the first surface, that is "above", the circuit board. The electrically conductive joint material 16 may thus extend from first surface, such as over the at least one first connection portion 14, to be in contact with the second connection portion 22. The electrically conductive joint material 16 may, in addition, be in contact with the adjacent side surface of the circuit board 11 which may (as will be shown and described in connection with FIG. 2 and various other figures herein) or may not comprise or define part of the first connection portion 14.

Furthermore, FIG. 1 illustrates, as an optional feature, a conformal coating 18, or an encapsulant or glob top layer, on the first surface and embedding at least the at least one electronics component 12 and optionally also portion of the circuit board 11 around component 12. The conformal coating 18 may be arranged to provide adhesion to a molded material layer, such as resin, and to avoid electronics components 12 becoming damaged, such as due the thermal expansion and/or CTE (coefficient of thermal expansion) mismatch, on the circuit board 11. The conformal coating 18 may be applied on top of circuit board 11 after it the electronics module 10 has been arranged or assembled onto second substrate 21. This can be done with normal printed circuit board (PCB) production equipment. Material of the conformal coating 18 may be, for example, however, not limited to plastic spray acrylate. The conformal coating 18 may be, alternatively or in addition, optically transparent, such as completely clear, or translucent, or opaque. This may be especially useful if the electronics module 10 is or comprises optical device(s)/component(s).

Still further is shown, as an optional feature, the use of adhesive 24 between the electronics module 10 and the second substrate 21. The adhesive 24 may be electrically non-conductive adhesive being provided, or dispensed, on the second side of the electronics module 10 or onto the second substrate 21. The adhesive 24, that is the second adhesive (preferably different than, in some examples, the conductive adhesive of the electrically conductive joint material 16), may comprise or consist of, for example, however, not limited to cyanoacrylate structural adhesive. In some embodiments, the adhesive 24 may comprise a thermal buffer, such as rubber.

Figure 2:
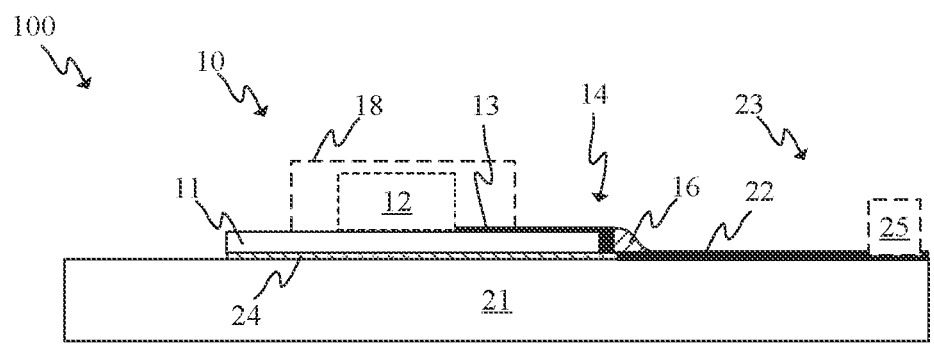
FIG. 2 illustrates schematically an electronics assembly.

FIG. 2 illustrates schematically an electronics assembly 100. The electronics assembly 100 is in many ways similar to the one illustrated in FIG. 1, however, the at least one first connection portion 14 is different. In this case, the at least one first connection portion 14 extends or substantially completely resides in the adjacent side surface of the circuit board 11. As shown in FIG. 2, the electrically conductive joint material 16 may only be arranged to be in contact with the adjacent side surface in order to establish the electrical connection between the first connection portion 14 and the second connection portion 22. Once again, only initially dispensable, preferably flowable, electrically conductive joint material 16 is visible, however, in some embodiments, conductive tape may be utilized instead.

Figure 3:
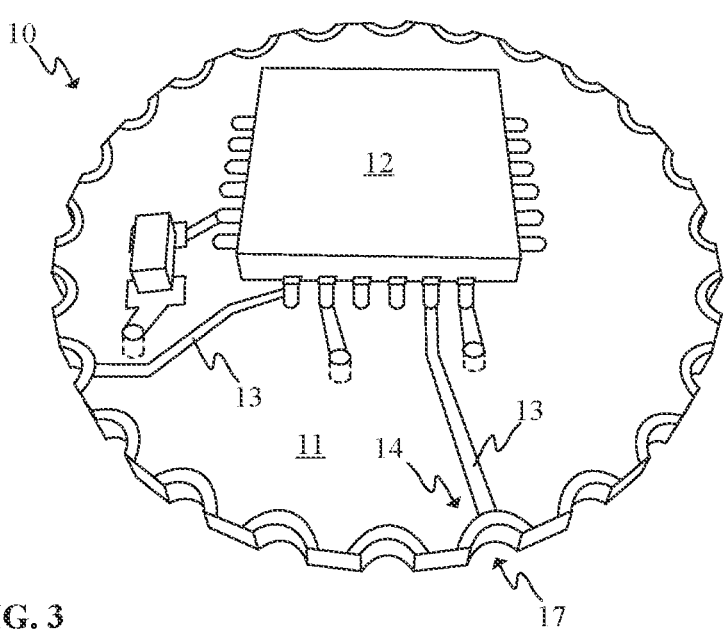
FIG. 3 illustrates schematically an electronics module.

FIG. 3 illustrates schematically an electronics module 10. The electronics module 10 is shown as a perspective view. As visible, the circuit board 11 may optionally comprise vias, such as through-holes, blind, or buried vias as is known to a skilled person in the art. However, as shown in FIG. 3, the at least one, preferably a plurality of, first connection portion(s) 14 may define or comprise one or several castellated or plated edges or half-holes 17.

Furthermore, in some embodiments, the shape of the circuit board 11 may be round, oval, ellipse or the like which does not define sharp corners ("sharp" being equal to or less than 90, that is an acute angle, or preferably less than 120, most preferably less than 135, degrees). Round shape works well with over molding, such as injection molding, and there is no need to assemble part to some special orientation. The round shape especially may also reduce the need for several mold flow simulations since the circuit board 11 is symmetrical and thus provides essentially same effect on the flow regardless of its position. However, in some embodiments, the shape follows or corresponds to a particular more complex shape, such as an icon.

In FIG. 3, a diameter of the circuit board 11, e.g. PCB, is 10 millimeters and it defines or comprises 24 castellated edge connection portions 17. As understandable, the diameter could be anything, for example, in the range of about 3 millimeters up to 100 millimeters. However, the diameter is, preferably, such as the electronics module 10 defines an electronics component like functional unit. A circuit board 11 having diameter of 20 mm might comprise 48, and so on.

The size of the castellated or plated edges or half-holes 17 may be, for example in the range of 0.2 to 5 millimeters, such as 0.7, 1.5, 2.4, 3.6, or 4.2 mm. In some preferable embodiments, the size may be less than or at most 1 mm.

Furthermore, it is to be understood that the number of first connection portions 14, in this case castellated or plated edges or half-holes 17, may be anything, such as in the range of one up to 50 or even more. For example, the number may be in the range of four to 36. The electronics module 10 as shown in FIG. 3 may operate, for example, capacitive sensors and LEDs. It may also be arranged to communicate to other ICs (integrated circuits) via a serial bus, for instance.

As there are no connecting pads underneath the electronics module 10, it can be assembled directly to the second substrate (e.g. with dispensable cyanoacrylate having rubber buffer providing enhanced resistance to shock and thermal cycling). The second substrate 21 may be, for example, an (FR700) polycarbonate film. Bonding is strong and this allows to place module 10 even directly under injection molding gate, if an injection molded layer is to be added on the electronics module 10, as will be described hereinafter with respect to some embodiments.

In various embodiments, a thin circuit board, such as PCB, may be used (for example, having thickness of 0.2-0.6 mm) since the circuit board 11 is adhered to the second substrate 21. Direct attachment also makes thermal path shorter allowing better heat dissipation and more power per module.

As also described hereinabove, the electrical connection by the electrically conductive joint material 16 may be done, in some embodiments, with conductive ink. In various embodiments, it is advantageously to conductive inks, such as stretchable conductive inks, which may be of the same material as in conductive traces of the second connection portion 22 and, optionally, also of the traces of the second circuitry 23.

The electrically conductive joint material 16 can be dispensed, if at least initial flowable, such as ink, so that it also covers part of the first connection portion 14 on the circuit board 11.

In some embodiments, the viscosity of the ink may be lower than 100 Pa·s at 25 degrees Celsius, such as being in the range of 10 or 15 to 35 or 60.

Figure 4:
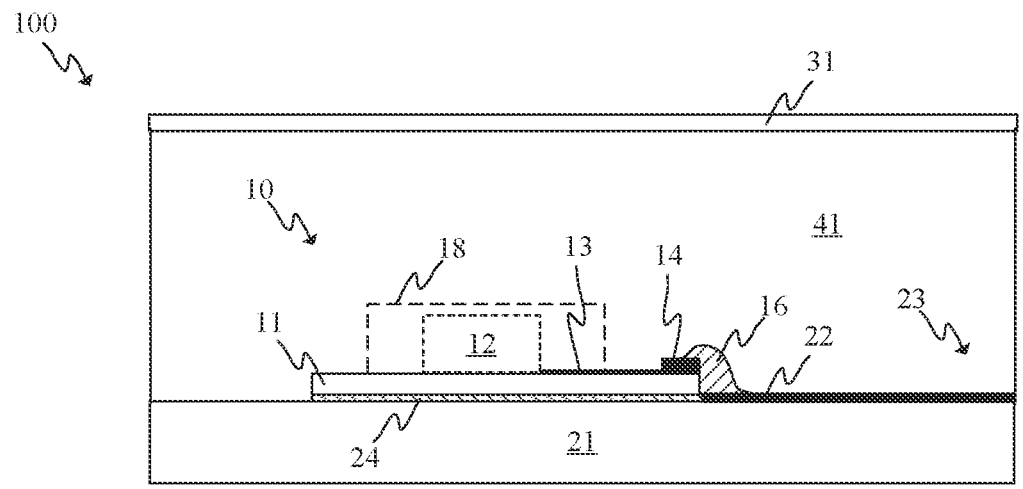
FIG. 4 illustrates schematically an electronics assembly.

FIG. 4 illustrates schematically an electronics assembly 100. The electronics assembly 100 is similar to the one illustrated in FIG. 1 and described in connection thereto. However, same applies also the embodiments in accordance with FIGS. 2 and 3.

As can be seen, the electronics assembly 100 may further comprise a molded, such as injection molded, material layer 41 embedding the electronics module 10. The molded material layer 41 may, for example, of thermoplastic material.

Furthermore, FIG. 4 illustrates an optional third substrate 31, such as a flexible film or sheet, for example, of thermoformable material, such as of plastic. The third substrate 31 may be laminated onto the molded material layer 41, or preferably, the molded material layer 41 has been injection molded between the second substrate 21 and the third substrate 31.

Figure 5:
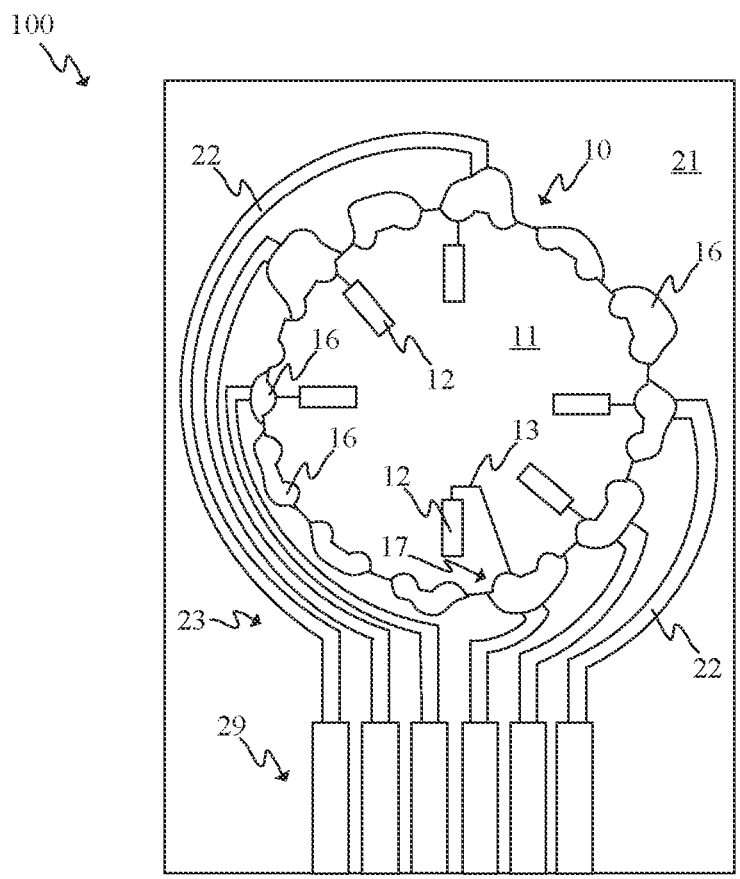
FIG. 5 illustrates schematically an electronics assembly.

FIG. 5 illustrates schematically an electronics assembly 100. The electronics assembly 100 is "above" that is showing the electronics module 10 on the circuit board 11. FIG. 5 also shows a further connector on the second substrate 21. The further connector may be connected to or be comprised in the second circuitry 23 on the second substrate 21. The second circuitry 23 may be, for example, printed, such as screen printed or inkjet-printed onto the surface of the second substrate 21. Other printing method may also be used.

Figure 6A:
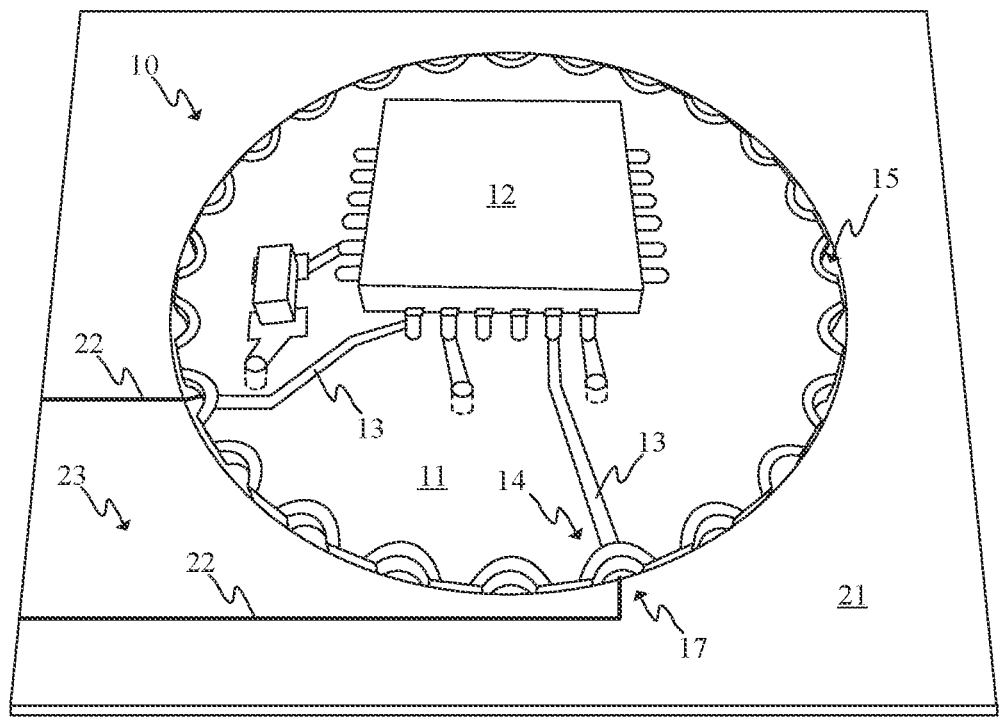
FIGS. 6A and 6B illustrate schematically an electronics assembly.
Figure 6B:
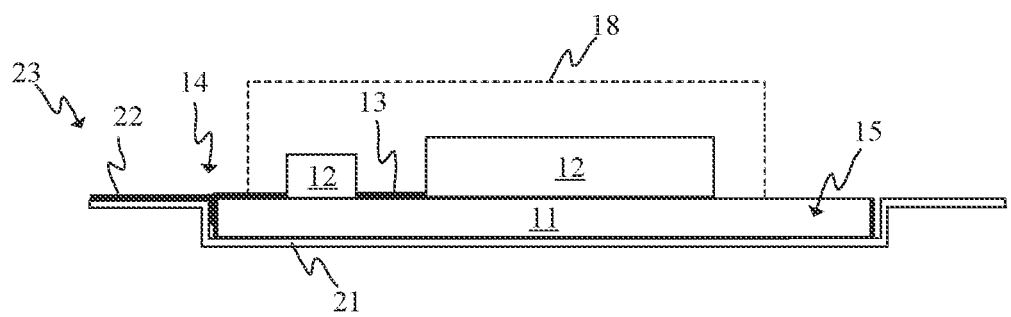

FIGS. 6A and 6B illustrate schematically an electronics assembly 100. FIG. 6A shows the assembly 100 as a perspective view, FIG. 6B as a cross-sectional side view. Furthermore, the assembly 100 is similar to the one shown in FIG. 5, however, the electronics module 10 has been arranged into a trench 15 or hole which is clearly visible in FIG. 6B. Thus, the assembly 100, namely the second substrate 21, may comprise the trench 15, such as including or being a depression or an indentation, to the second substrate 21, the trench 15 having a shape and a lateral size such that the electronics module 10 fits laterally into the trench 15. Furthermore, the trench 15 may be provided by thermoforming the second substrate 21. The trench 15 may preferably have a shape which is in accordance with the shape of the module 10, that is follows outlines of the module 10. In FIG. 6, the trench 15 is round, however, it could have protrusions at positions of the castellations 17. The trench 15 preferably provides a tight fit for the module 10, that is the trench 15 is just slightly larger than the circuit board 11 in the lateral direction. The electronics module 10 can thus be assembled in the trench 15 after thermoforming process of the substrate 21. By arranging the electronics module 10 into the trench 15 can provide substantially flat or even surface to the structure if the electronics module 10 fills the trench 15, as is shown in FIG. 6B. By this, cracking or breaking of the substrate 21 and/or the electronics module 10 may be avoided or at least its probability decreased in injection molding process, since the surface onto which the injection molding is performed is essentially flat or even. However, the trench 15 is not necessarily as deep as the thickness of the electronics module 10 or the circuit board 11. The trench 15 may be deeper than that or less deep.

The electronics module 10 with the first connection portion 14, such as castellations 17, may thus be arranged to a thermoformed substrate 21 having the trench with a snap-on electromechanical connection. Arranging the electronics module 10 to the trench provides protection against thermal cycling or moisture breaking, and making thinner overall assembly 100 possible.

Thicker circuit board 11 may be used, e.g. 0.6-1.6 mm, for making larger surface area for connection between the at least one first connection portion 14 and the second 22 connection portions directly and by the electrically conductive joint material 16. In an embodiment, a "vertical" conductive tape may be utilized between the at least one first connection portion 14 and the second 22 connection portions.

In some embodiments, the connection portions 14, 22 may be coated with graphite for better durability on the connection area.

In some embodiments, the trench may be filled with protective coating, similar to the conformal coating or the like filler material.

Figure 7A:
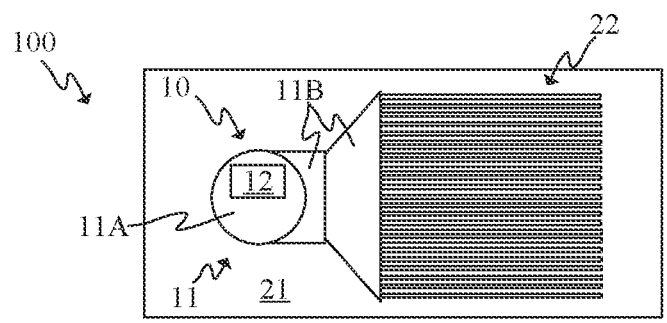
FIGS. 7A and 7B illustrate schematically an electronics assembly.
Figure 7B:
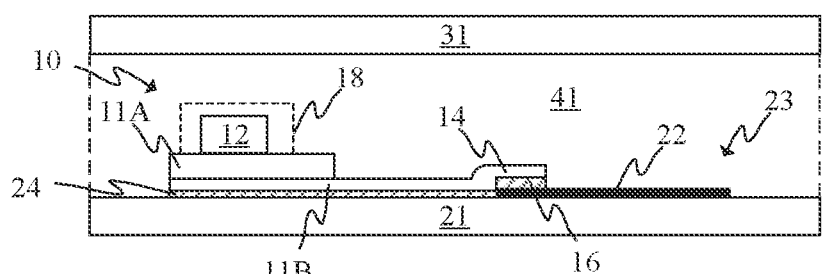

FIGS. 7A and 7B illustrate schematically an electronics assembly 10. The circuit board 11 may comprise a rigid portion 11A and a flex portion 11B attached to each other, wherein the at least one first connection portion 14 is comprised in the peripheral portion of the flex portion 11B. Regarding the electrical connection between the at least one first connection portion 14 and the second 22 connection portions, the electrically conductive joint material 16 such as described hereinbefore may be utilized as well as, optionally, castellations 17. An adhesive 24, such as electrically non-conductive adhesive may be utilized to attach the module 10 to the second substrate 21 and/or to the third substrate 31 (with, for example, anisotropic conductive film).

As can be seen, in the electronics module 11, several trace or conductive lines from relatively small rigid portion 11A may be easily established. In FIG. 7B, the electrically conductive joint material 16 may, preferably, be conductive adhesive, such as anisotropic conductive adhesive or film.

The electronics component 12 may be, for example, an integrated circuit. In some embodiments, the electronics module 10 may operate, for example, as analog front end right next to, for example, a sensor even in large IMSE parts. Digital control and power may be provided from an external source.

In some embodiments, such electronics modules 10 may be utilized in both the second substrate 21 and the third substrate 31, and optionally specifically close to the edge of the substrates 21, 31 for providing connectors or connector-like arrangements.

Furthermore, the electronics assembly 100 such as shown in FIGS. 7A and 7B may be utilized in connection with touchpads, capacitive sliders, button matrixes, capacitive and inductive buttons.

Figure 8A:
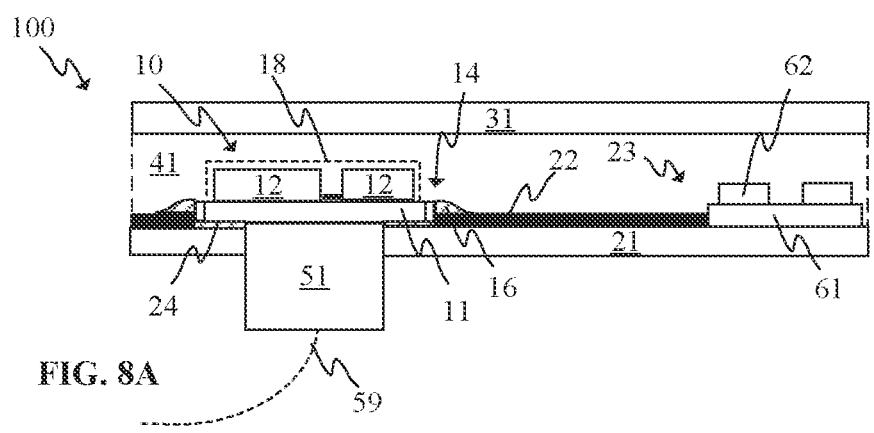
FIG. 8A illustrates schematically an electronics assembly.
Figure 8B:
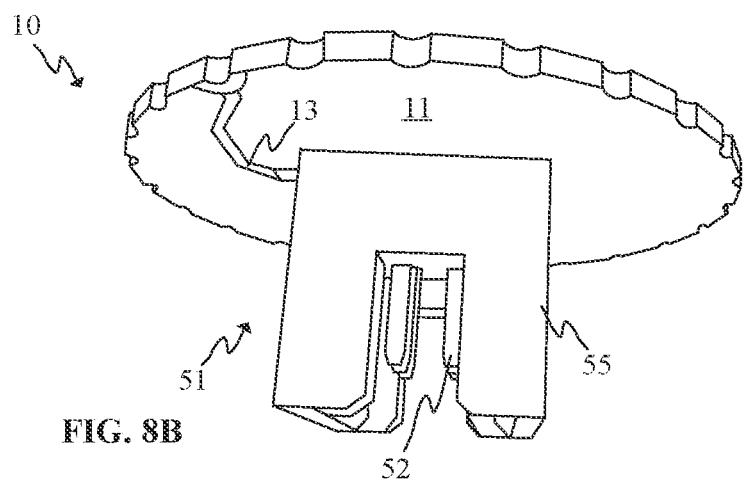
FIG. 8B illustrates schematically an electronics module comprising a connector.

FIG. 8A illustrates schematically an electronics assembly 100. FIG. 8B illustrates schematically an electronics module 10 comprising a connector 51. The at least one electronics component 12 may, in some embodiments, be a connector 51 for providing electrical connection between an external entity and the first circuitry 13, preferably the connector 51 extending through a hole in the second substrate 21. There may be, in addition, other electronics components 12 on the opposite side of the circuit board 11, such as shown in FIG. 8A and 8B. An external conductor 59 is also shown which can be connected to the connector 51.

Furthermore, the first electrical connection portion 14 may advantageously comprise castellations 17. The connector 51 may comprise pins 52 or the like and a connector housing 55.

In some embodiments, the second circuitry 23 may comprise a further substrate 61, such as a rigid substrate. There may be further electronics components 62 arranged onto the further substrate 61, such as high power LEDs.

In various embodiments, the connector 51 may have, for example, 2-8 pins or terminals with a pitch, for example, in the range of 0.5 mm to 3 mm. However, there can also be up to or even more than 40 pins with smaller pitch, and/or a multirow connector may be used.

In an embodiment, the top side of the module 10, that is the opposite side relative to the connector 51, may be utilized for various applications, such as power noise filtering and power boost with capacitors, USB-UART (Universal asynchronous receiver-transmitter) or USB-I2C (Inter-Integrated Circuit communication), USB-SPI (Serial Peripheral Interface) in consumer products, CAN (Controller Area Network)-UART, LIN (Local Interconnect Network)-UART in automotive applications, LED driver (MOS)FET, etc.

In some embodiments, the thickness of the circuit board 11 may be more than 0.6 mm to provide secure platform for connector 51.

Furthermore, the circuit board 11 may comprise holes for attachment pins of the connector 51 if such are used in the selected connector model. These holes may be utilized in injection molding process to keep the module 10 in place during the process.

In an embodiment, the connector 51 may be secured and protected with a sealant after it has been attached to the circuit board 11.

In some embodiments, the electronics module 10 may be produced by cutting the second substrate 21 open, or removing portion thereof. Then adhesive 24 may be dispensed on the substrate 21. The circuit board 11 may then be assembled without the connector 51. The substrate 21 may then optionally be thermoformed, if desired. After that an injection molded material layer 41 may be provided to embed the circuit board 11 and electronics components 12 thereon. Finally, the connector may be attached to the circuit board 11 through the opening in the second substrate 21, such as utilizing heat, infrared, or hot air in soldering the connector 51 to the circuit board 51. The connector 51 may be further secured with adhesive.

In some embodiments, the injection molded layer 41 may, alternatively, be provided before removing a portion of the second substrate 21 for arranging the connector 51.

In various embodiments, there may be such electronics modules 10 having the connector 51 on both the second 21 and the third 31, if any, substrates.

Figure 9:
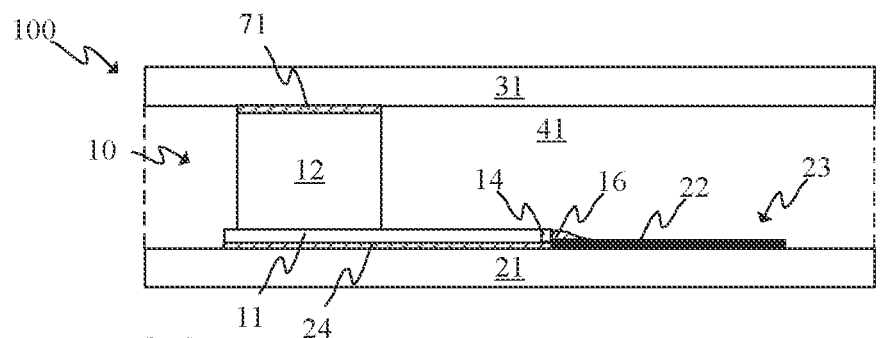
FIG. 9 illustrates schematically an electronics assembly.

FIG. 9 illustrates schematically an electronics assembly 100. The at least one electronics component 12 may, in some embodiments, be a segment display, such as a 7-segment, 8-segment, or 16-segment display. In addition, optionally, the third substrate 31 may be attached to a surface of the segment display being on the opposite side of the display than the circuit board 11, as shown in FIG. 9, such as by an optically transparent adhesive, film, or tape. Furthermore, the third substrate 31 may be attached to the first surface of the circuit board 11 by third adhesive 71, such as an adhesive or film or tape.

Figure 10A:
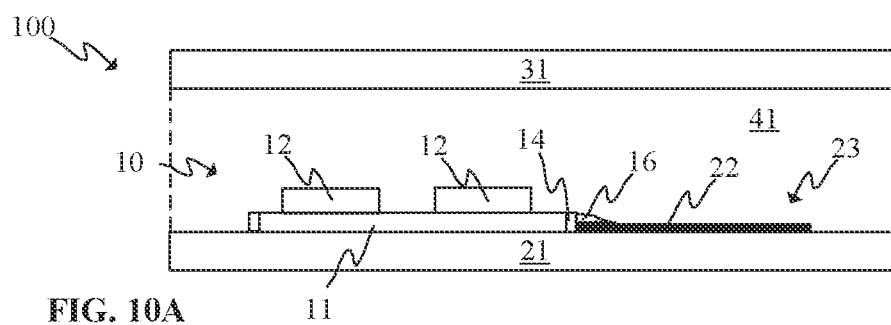
FIGS. 10A, 10B and 10C illustrate schematically an electronics assembly.
Figure 10B:
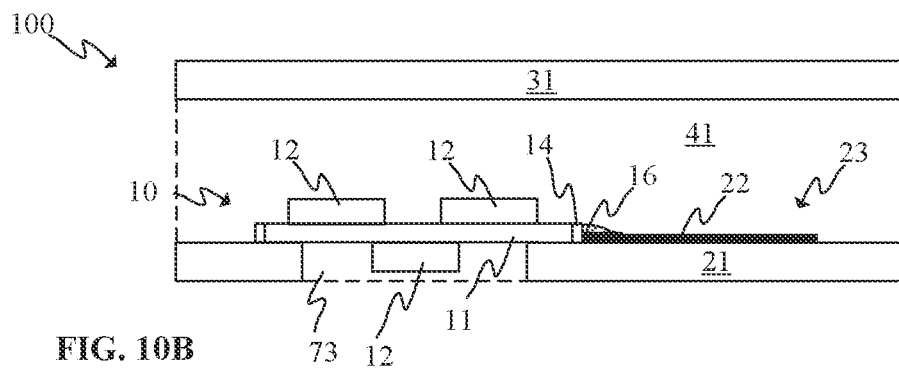
Figure 10C:
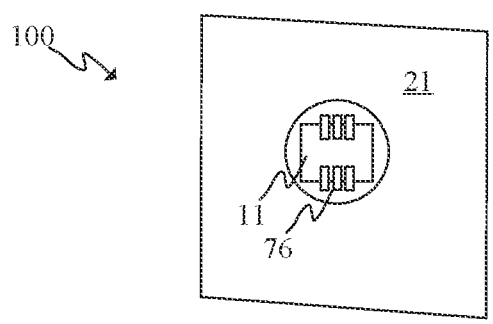

FIGS. 10A-10C illustrate schematically an electronics assembly 100. In FIG. 10A is shown similar assembly 100 as in FIG. 2, for instance, comprising also the third substrate 31 and the molded material layer 41. FIG. 10B shows the same assembly, however, with having a removed portion of the second substrate 21 to expose the circuit board 11 for arranging the at least one electronics component 12 on the exposed portion of the second surface 21. FIG. 10C shows the electronics assembly of FIG. 10B so from the opposite side of the second substrate 21 relative to the electronics module 10. FIG. 10C shows further connection portions 76, such as pads for connecting electronics components 12. The cavity or exposed opening may be filled with conformal coating or other filler 73, such as adhesive, for instance.

With the described process in connection with FIGS. 10A and 10B, for example, IC chips and other expensive electronic parts are assembled after part has been manufactured and passed qualification tests. Method/process also increases usable surface on inmold circuit board, such as PCB, as electronics components may now be assembled also into bottom side of the modules 10. Thus, in FIG. 10B, for instance, the electronics components 12 on the first surface may be less expensive and more robust, and on the opposite "bottom" side can reside more expensive and fragile components 12.

FIGS. 11A and 11B illustrate schematically an electronics assembly 100. In FIGS. 11A and 11B especially capacitive sensing device/structures are shown. Therefore, the at least one electronics component 12 may include one or more capacitive sensing elements, such as electrodes 81. FIGS. 11C-11F illustrates related electronics modules 10.

In various embodiments, the electronics module 10 may comprise a ground layer 84 on the opposite side thereof relative to the one or more capacitive sensing elements 81, 81A, 81B, namely self-capacitive 81, RX 81A, and TX 81B electrodes. There may also be shielding elements 82 present in the module 10.

In these embodiments, the module 10 may be utilized to bring capacitive electrodes 81, 81A, 81B closer to surface, that is the third substrate 31. In various embodiments, the thickness of the circuit board 11 may be about or more than half of the thickness of the molded material layer 41.

In an embodiment shown in 11C, the circuit board 11 with self-capacitive electrode 81 and a ground plane 84 may be used to prevent false touch from the side of the second substrate 21. Alternatively, the ground plane 84 may be provided onto the second substrate 21 at the corresponding position with the module 10.

Instead of capacitive sensing elements, there may be appropriately inductive or force sensing elements, such as described above relative to the capacitive sensing elements.

FIG. 11D shows module 10 with mutual capacitive "rake" structure, that is there is RX 81A electrode in the middle and TX electrodes 81B on both side thereof. Furthermore, there is also a ground 84 on the opposite side of the circuit board 11, either on the circuit board 11 or on the second substrate 21.

FIG. 11E illustrates a module 10 having projected capacitive structure. The RX 81A and TX electrodes 81B may be routed different way to the module 10 to prevent false touch. The RX electrode 81A may be hatched for better performance.

FIG. 11F illustrates a module 10 with a capacitive button/electrode 81 with shield electrodes 82 for water tolerant touch. Also guard electrode can be applied if running water is present.

FIG. 11G illustrates that there may also be other electronics components 12 on the circuit board 11, such as LEDs, for instance.

Figure 12:
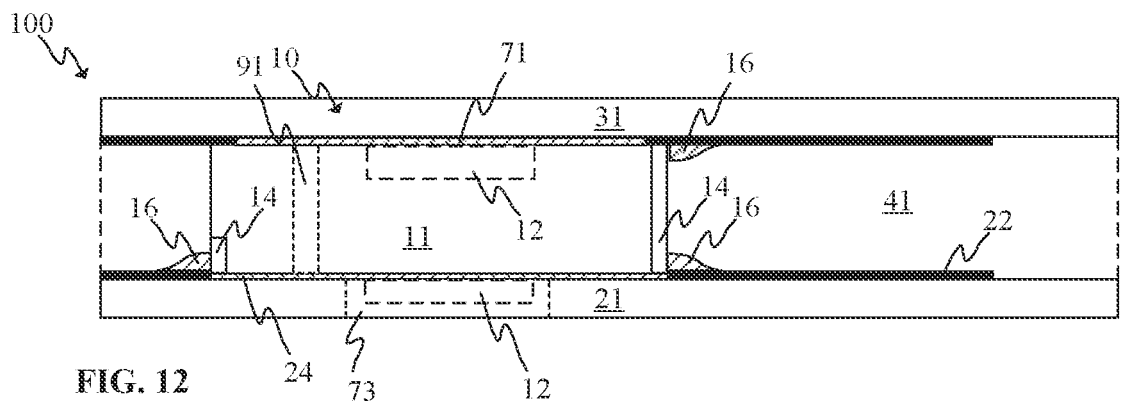
FIG. 12 illustrates schematically an electronics assembly.

FIG. 12 illustrates schematically an electronics assembly 100. The electronics assembly 100 may comprise the electronics module 10, particularly the circuit board 11 thereof, extending through the molded material layer 41 between the second 21 and the third 31 substrates for providing a reliable and high-density connection between two substrates 21, 31. The electronics module 10 may be squeezed between the two substrates 21, 31. The module 10 maybe assembled in other of the substrates 21, 31 in, for example, an SMT process, and then connected to its circuitry 13, 22 with conductive adhesive or ink, or by soldering or conductive tape. Electrical and/or mechanical connection to the other one of the substrates 21, 31 may then be done with, for example, a anisotropic conductive adhesive or film during injection molding process.

Furthermore, in some embodiments, the electronics component 12, such as shown with dashed lines in upper part of the circuit board 11, may be arranged into a cavity on the first surface of the circuit board 11.

In various embodiments, as described already hereinbefore, an electronics component 12, such as a fragile IC chip, may be added after molding as post process step by removing a portion of the second substrate 21 or into a ready-made opening thereon. The opening may be filled with conformal coating 18 or other filler 73.

The circuit board 11 may also comprise via(s) 91 extending through the circuit board 11 which may be used to provide the connection between the substrates 21, 31. As visible, also the first connection portion 14 may extending, in thickness direction, through the circuit board 11.

In some embodiments, to better withstand dimensional variations of circuit board 11s during the molding process, silicone rubber mold insert can be used.

Figure 13A:
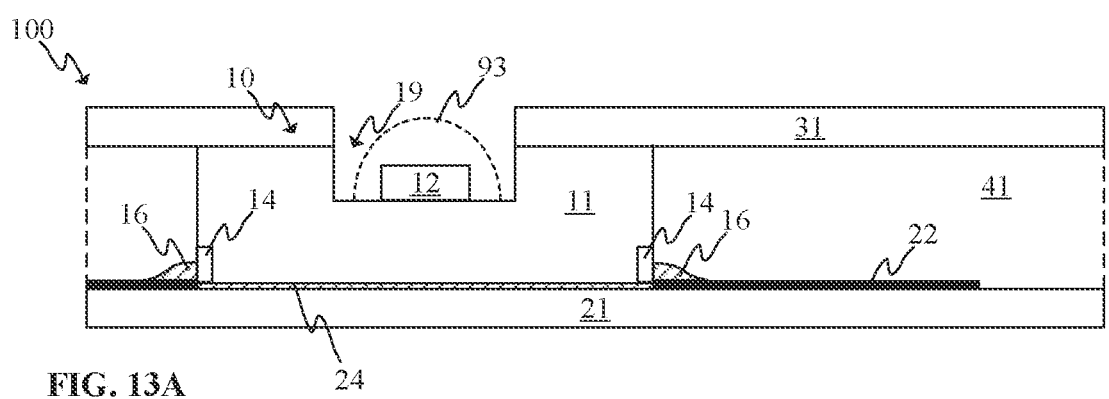
FIGS. 13A, 13B and 13C illustrate schematically an electronics assembly.
Figure 13B:
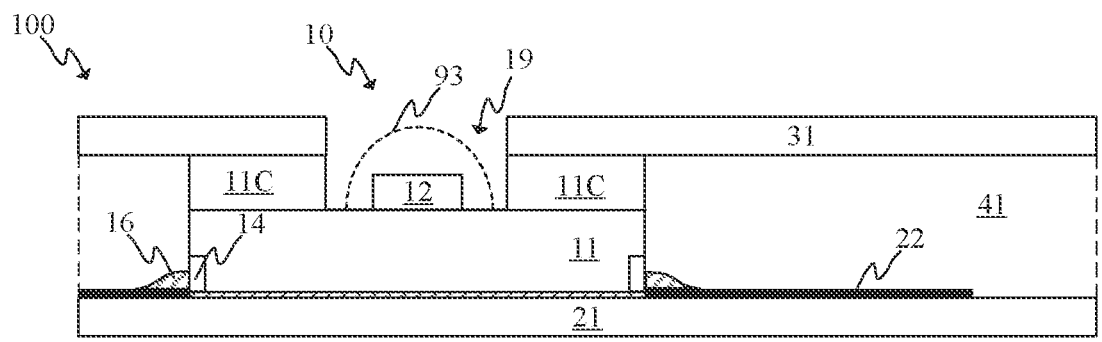
Figure 13C:
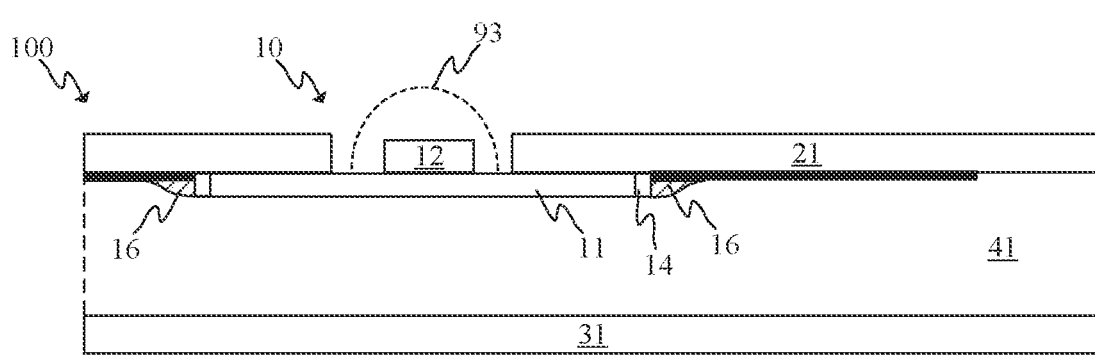

FIGS. 13A-13C illustrate schematically an electronics assembly 100. In various embodiments, the circuit board 11 may comprise a cavity 19 on the first surface thereof, as described briefly hereinbefore.

In various embodiments, a portion of the third substrate 31 may be removed to expose the cavity 19 for arranging one or several electronics components 12, such as a passive infrared sensor, to the cavity 19. Optionally, the third substrate 31 may be attached by a third adhesive to the circuit board 11 to surface portion outside the cavity 19 at the first side thereof. An optional lens 93, such as a Fresnel and/or a High-density polyethylene (HDPE) lens covering the electronics components 12 in case of infrared sensor or the like, since such sensors work at wavelengths around 7-14 micrometers which are blocked by many thermoplastics like polycarbonate and acrylic. Thus, care must be taken to ensure that the sensor operates appropriately.

In various embodiments, the cavity 19 may be exposed by removing a portion of the third substrate after providing the molded material layer 41 between the substrates 21, 31.

FIG. 13B illustrates using two circuit boards 11, 11C instead of using circuit board 11 with a cavity 19. Thus, a second circuit board 11C may be attached to the third substrate 31 on the side facing or to be facing the electronics module 10, wherein the second circuit board 11C may comprise a through-hole. On the other hand, the second circuit board 11C may be directly attached or additionally attached to the circuit board 11.

FIG. 13C shows an embodiment in which the circuit board 11 is attached to the upper substrate, in this case, the second substrate 21. A cavity is provided by an opening in the second substrate 21. In some embodiments, a lens 93 may be used. On the other hand, the electronics component 12, if being an infrared sensor or the like, may include a narrow lens and can fit to small hole define by the opening in the second substrate 21.

Figure 14:
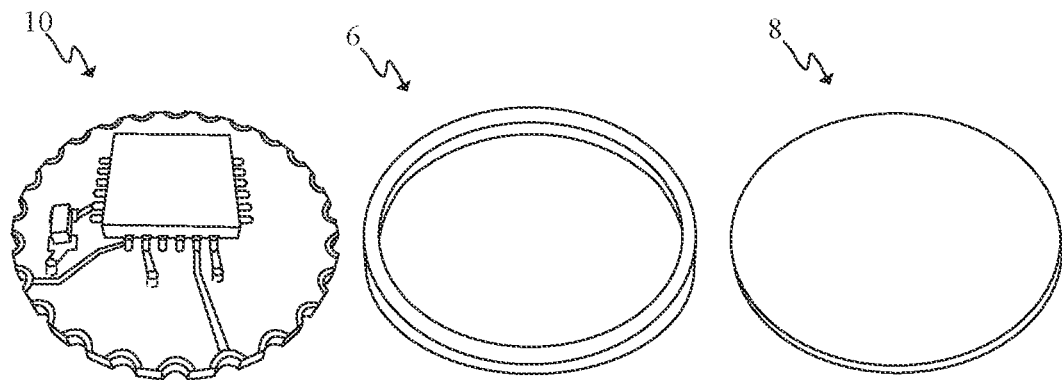
FIG. 14 illustrates schematically an electronics module.

FIG. 14 illustrates schematically an electronics module 10. The module 10 may comprise a protective ring 6 on the circuit board 11 and around the at least one electronics component 12, the protective ring 6 optionally comprising a cover 8 on the opposite side relative to the circuit board 11. These are further illustrated in FIGS. 15A and 15B. In various embodiments, the ring 6 and the cover 8 may be manufactured as a single piece part.

Figure 15A:
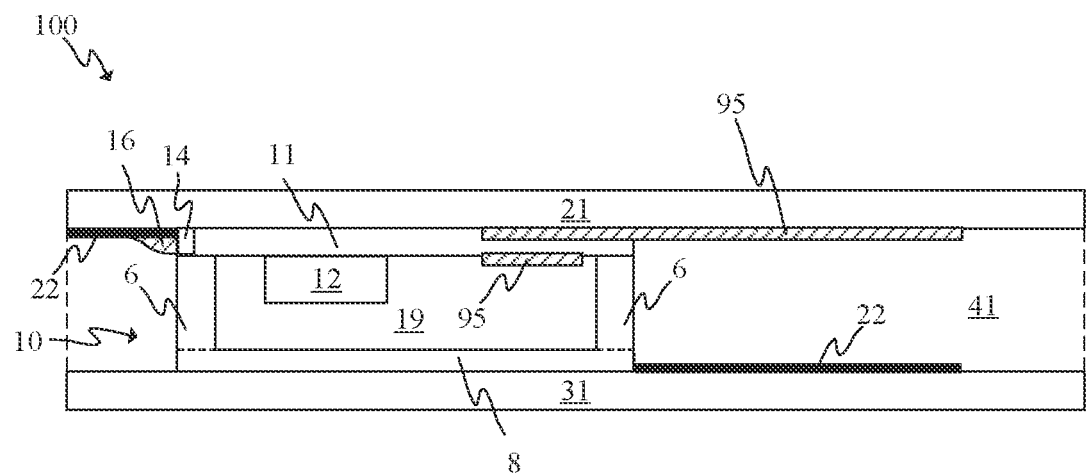
FIGS. 15A and 15B illustrate schematically an electronics assembly.
Figure 15B:
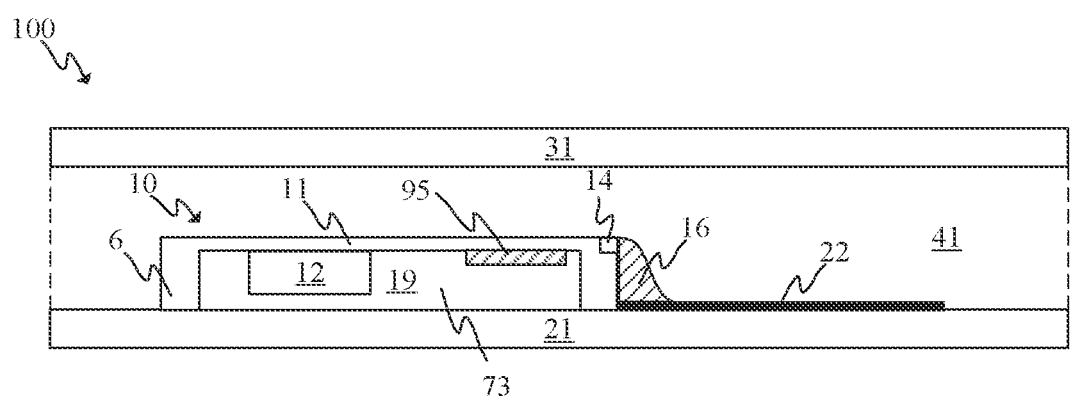

FIGS. 15A and 15B illustrate schematically an electronics assembly 100. The electronics component 12 in these figures is preferable a wireless module for wireless communication. The circuit board 11 may thus comprise an antenna element 95, or elements 95, such as a printed antenna or a ceramic antenna.

Thus, the electronics component 12, which may be delicate, may be placed inside the module 10 which is assembled between substrates 21, 31. Side walls of the protective ring 6 can withstand high molding pressures especially if they are low.

FIG. 15A shows the module 10 providing a protective pocket for delicate components 12. Antenna 95 may be a printed antenna, ceramic antenna, or capacitively coupled antenna utilizing large surface area such as shown in FIG. 15A.

In some embodiments, the ring 6 and the cover 8 may be attached to different substrates 21, 31 and then mated during the injection molding.

In some embodiments potting material or other filler 73 may be provided into a space defined by the protective ring 6 and the circuit board 11, and optionally the cover 8, as shown in FIG. 15B.

Figure 16A:
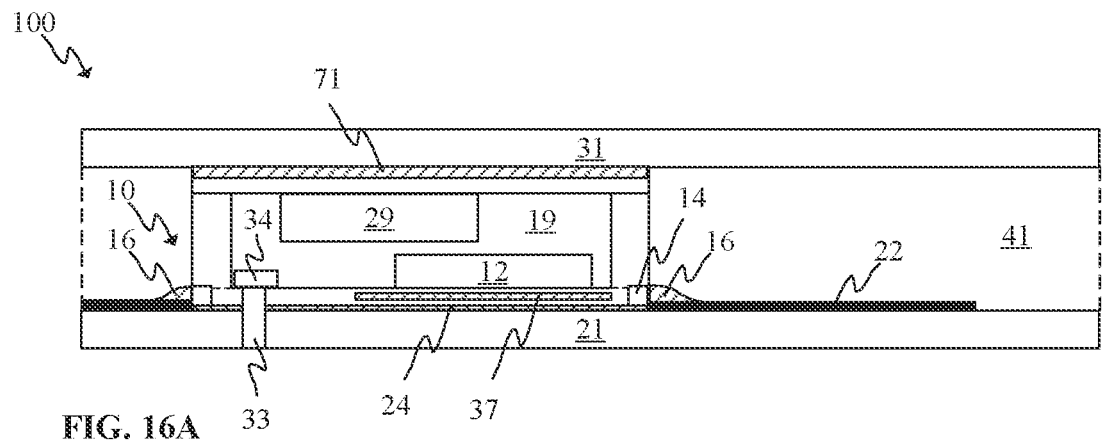
FIGS. 16A, 16B and 16C illustrate schematically an electronics assembly.
Figure 16B:
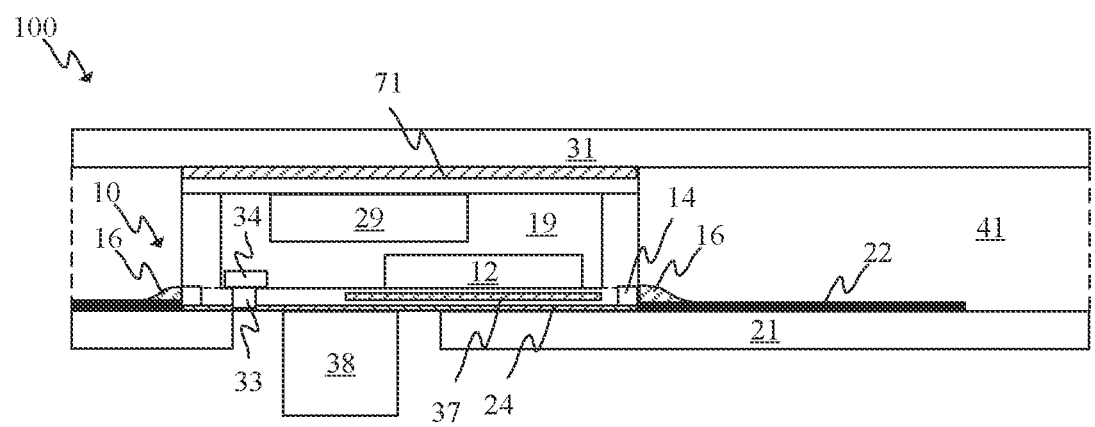
Figure 16C:
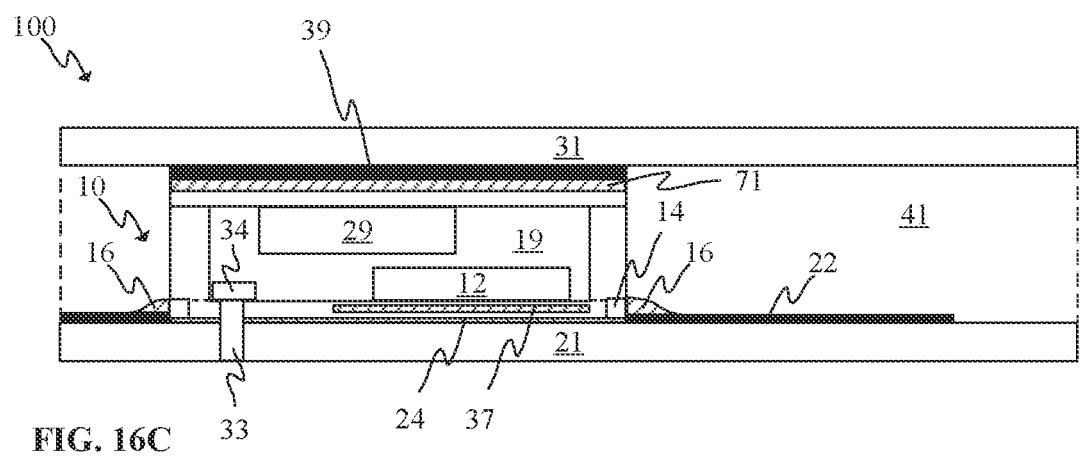

FIGS. 16A-16C illustrate schematically an electronics assembly 100. The electronics module 10 may further comprise an electrical energy storage 29, such as a battery. Furthermore, there may be a vent 33 for evening out pressure and/or providing ventilation into the space comprising the electrical energy storage 29. Furthermore, there may be a protective vent tape 34 arranged onto the vent opening.

In some embodiments, there may also be an optional induction loop 37 or the like via which electrical energy may be wireless transmitted to the module 10. Alternatively, as shown in FIG. 16B, a charging port 38 may be provided. This may be done in similar manner as was described hereinbefore in connection with FIGS. 8A and 8B for the connector 51.

In some embodiments, the module 10 may comprise a photovoltaic cell 39 for providing charging to the electrical energy storage 29. The photovoltaic cell 39 may be arranged to between the module 10 and the third substrate 31. In these cases, the third substrate 31 may be transparent or comprise a transparent window, or merely an opening at the corresponding position with the photovoltaic cell 39. There may be a transparent adhesive, film, or tape used between the third substrate 31 and the photovoltaic cell 39.

Figure 17A:
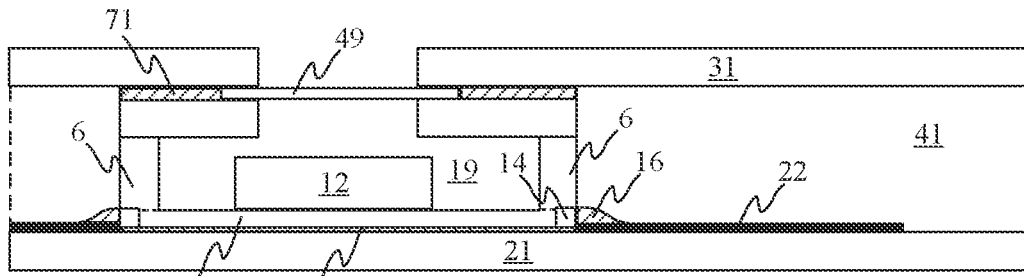
FIGS. 17A, 17B, 17C, 17D, and 17E illustrate schematically an electronics assembly.

FIGS. 17A-17E illustrate schematically an electronics assembly 100. In FIG. 17A, the electronics component 12 is a gas sensor, and in In FIGS. 17B-17E, an audio device.

Regarding FIG. 17A, a gas sensor is arranged onto the circuit board 11, and there is a gas vent in fluid communication with the gas sensor via an opening in the third substrate 31.

The gas sensor may be a barometric pressure sensor, gas compound level sensor ($CO$, $CO_2$, $O_2$, $H_2O$, VOC), particle/smoke sensor, or the like.

In various embodiments, the gas sensor is arranged into a cavity on the first surface of the circuit board 11 or the protective ring 6 may be utilized. In case of using the ring 6, the protective ring 6 may be assembled/attached on the third substrate 31, such as by adhesive. The circuit board 11 may be attached to the second substrate 21. Then the two parts may be brought together during the molding. The two parts may be attached to each other before the molding or even before attaching to a substrate.

In some embodiments, a venting film 49 may be utilized at the opening of the third substrate 31.

Regarding FIGS. 17B-17E, the electrical component 12 may be an audio device, such as a speaker, a microphone, or an audio transducer, or the like, such as ultrasound transceiver, buzzers. With these devices it is possible to implement features like haptics, distance measurements (parking radar), alarm devices (fire alarms) and speakers.

Figure 17B:
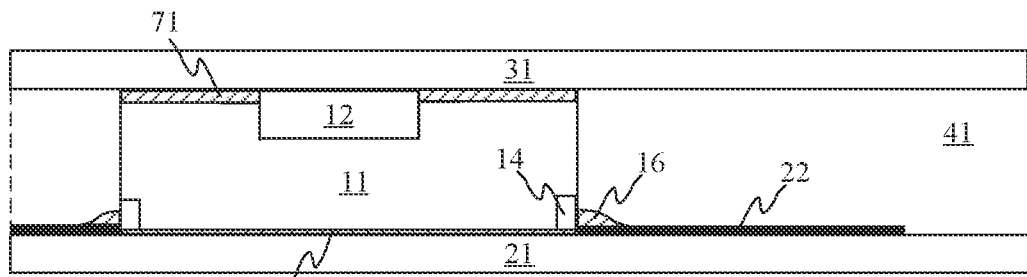

FIG. 17B illustrates an electronic assembly 100 comprising a transducer that operates based on the whole device surface reflecting or vibrating with sound. No holes are thus needed in the third substrate 31.

Figure 17C:
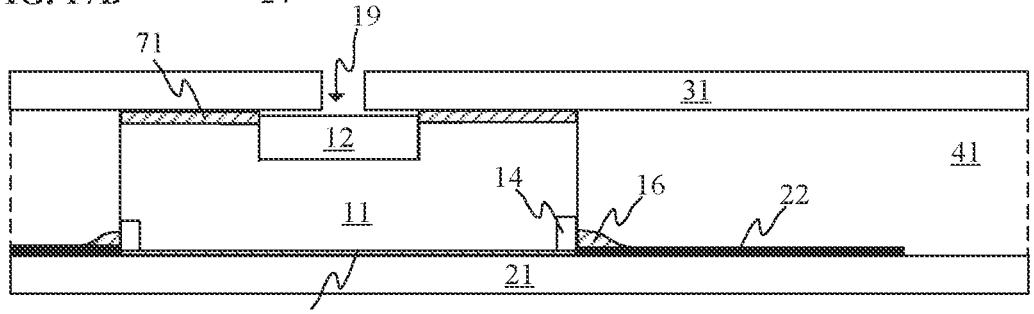

FIG. 17C illustrates an electronic assembly 100 comprising an audio device in a cavity on the first surface of the circuit board 11. There is also a small opening in the third substrate 31 so that the audio signal, or sound, can exit the assembly 100 via the opening.

FIG. 17C illustrates an embodiment which comprises an integrated grill or foam cover 77 in the audio device. The cover 77 advantageously fits, preferably tightly, into the opening in the third substrate 31.

Figure 17D:
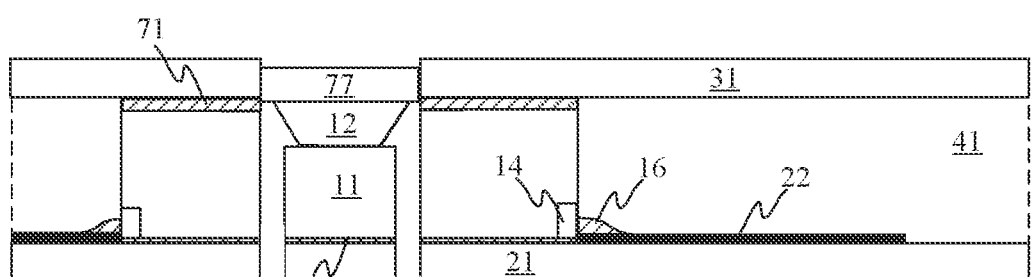

FIG. 17D illustrates a ported speaker design improves bass frequency response by having a channel 78 extending within the circuit board 11 and from the audio device and through the second substrate 21, thereby acting as a kind of a bass reflex.

Figure 17E:
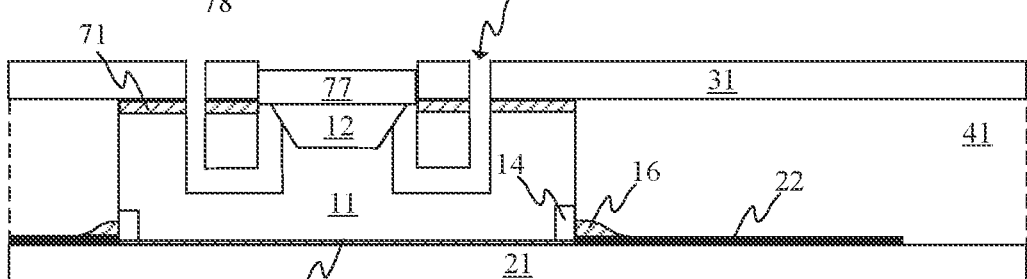

FIG. 17E illustrates another ported speaker design in which the channel 78 extending within the circuit board 11 and through the third substrate 31.

Regarding all FIGS. 17A-17E, the holes or openings in the third 31 and/or the second 21 substrate may be produced before the injection molding process or after it.

Figure 18:
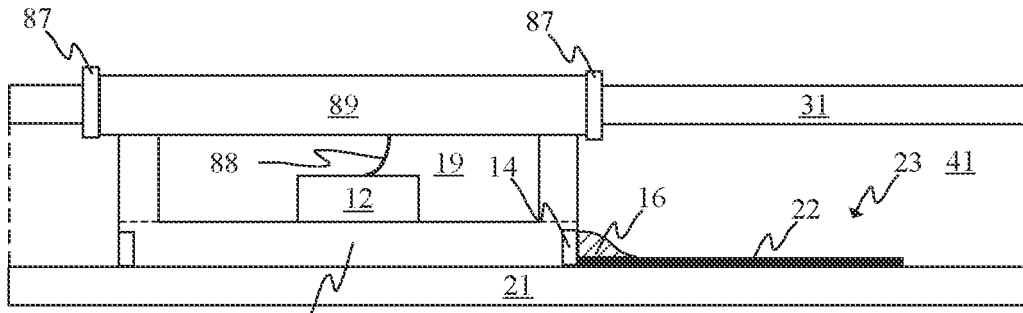
FIG. 18 illustrates schematically an electronics assembly.

FIG. 18 illustrates schematically an electronics assembly 100. In FIG. 18, the module 10 defines or includes a cavity on the first surface of the circuit board 11. There may be a display 89 arranged to an opening, such as a space left by removing a portion of the third substrate 31, in the third substrate 31. Furthermore, there may be a display flex 88 with which the display 89 can be powered and controlled. The display flex 88 may be connected to the electronics component 12 on the circuit board 11, which may comprise a controller of the display, such as ICs and memory, etc.

Once again, the cavity may be produced by having a cavity on the circuit board, or by the protective ring 6, or by having the further circuit board 11C, such as described in connection with FIG. 13B.

In various embodiments, the display 89 can be arranged to its space and electrically connected to the component 12 after the injection molding. The assembly 100 may also comprise a bezel 87 for hiding the seams.

Figure 19:
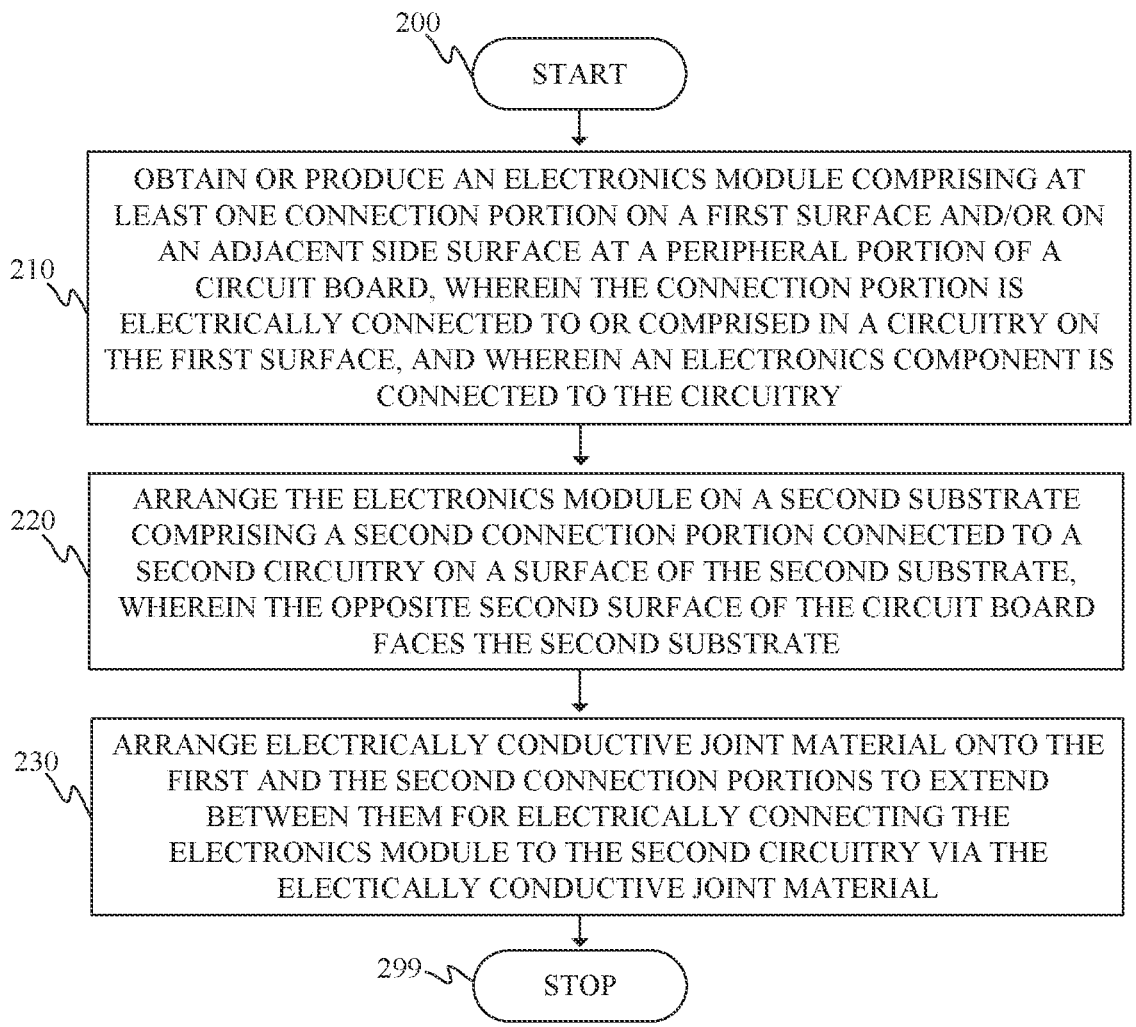
FIG. 19 shows a flow diagram of a method for manufacturing an electronic assembly.

FIG. 19 shows a flow diagram of a method for manufacturing an electronics assembly 100.

Step or item 200 refers to a start-up phase of the method. Suitable equipment and components are obtained and systems assembled and configured for operation.

Step or item 210 refers to obtaining or producing 210 an electronics module 10, wherein the electronics module 10 comprises a first circuitry 13 on a first surface at a first side of a circuit board 11, at least one electronics component 12 on the circuit board 11 and in electrical connection with the first circuitry 13, and at least one first connection portion 14 on the first surface and/or an adjacent side surface at a peripheral portion of the circuit board 11, wherein the at least one first connection portion 14 is electrically connected to or is comprised in the first circuitry. The first circuitry 13 may comprise traces and/or contact pads, or circuit pattern(s), which may be produced by in an additive, such as printing, or in a subtractive manner, such as etching.

Step or item 220 refers to arranging the electronics module 10 on a second substrate 21, such as on a thermoformable film or sheet, preferably of plastic material, comprising a second connection portion 22 connected to a second circuitry 23 on a surface of the second substrate 21, wherein a second surface of the circuit board 11, being on the opposite second side than the first surface, faces the second substrate 21. The second circuitry 23 may comprise traces and/or contact pads, or circuit pattern(s), which may be produced by preferably in an additive, such as printing, or in a subtractive manner, such as etching.

Step or item 230 refers to arranging electrically conductive joint material 16 onto the at least one first connection portion 14 and the second connection portions 22 to extend between them for electrically connecting the electronics module 10 to the second circuitry 23 via the electrically conductive joint material 16. In various embodiments, the connection may, thus, preferably be made between the top and/or the side surface of the circuit board 11 having the at least one, or a plurality of, first connection portion(s) 14 and the second connection portion 22, preferably arranged onto the top surface of the second substrate 21. In various embodiments, the electrically conductive joint material 16 may be one selected from the group consisting of: solder material, such as melted or stencil printed solder, conductive adhesive, conductive ink, conductive tape or film, for example, asymmetric conductive tape or film, or anisotropic conductive film (ACF).

In some embodiments, the electrically conductive joint material 16 may be at least initially dispensable, preferably flowable, such as conductive adhesive or ink, or melted or stencil printable solder material, and the arranging of the electrically conductive joint material 16 comprises dispensing it on the at least one first connection portion 14 and the second connection portions 22.

Method execution may be stopped at step or item 299.

In various embodiments, the first connection portion 14 may comprise one or a plurality of conductive pads at the peripheral portion on the first surface at the first side of the circuit board 11.

Alternatively or in addition, the first connection portion 14 may include one or several castellated or plated edges or half-holes 17. They may be arranged to the peripheral portion.

Furthermore, the connection portion 14 may comprise one or several vias or plated holes, such as for facilitating establishing of the electrical connection by the electrically conductive joint material 16.

The arranging 220 of the electronics module 10 may comprise attaching the electronics module 10 to the second substrate 21 by a second adhesive 24, preferably an electrically non-conductive adhesive, such as anisotropic conductive adhesive or film (ACF), provided on the second side of the electronics module 10.

In various embodiments, the method may comprise applying a conformal coating 18 onto the first surface to embed at least partly the at least one electronics component 12.

In some embodiments, the method may comprise forming, such as thermoforming, the second substrate 21 at least locally from a planar shape to exhibit a non-planar or 3D shape, such as a convex and/or concave surface portion, prior to or after the arranging of the electronics module 10 on the second substrate 21. The non-planar shape may be the trench 15 and/or other non-planar shape(s).

As described hereinbefore, the method may comprise providing the trench 15, such as including or being a depression or an indentation, to the second substrate 21, the trench 15 having a shape and a lateral size such that the electronics module 10 fits laterally into the trench 15, preferably so that at least two side edges of the electronics module 10 become in contact with the corresponding side surfaces of the trench 15 in the lateral direction. Furthermore, the trench 15 may be provided by thermoforming the second substrate 21.

In various embodiments, the method may comprise obtaining or producing the circuit board 11 to comprise a rigid portion 11A and a flex portion 11B attached to each other. In addition, optionally, the at least one first connection portion 14 may be comprised in the peripheral portion of the flex portion 11B.

In some embodiments, the method may comprise the at least one electronics component 12 being a connector 51 for providing electrical connection between an external entity and the first circuitry 13, preferably the connector 51 extending through a hole in the second substrate 21.

Furthermore, the method may comprise arranging a third substrate 31, such as on a thermoformable film or sheet, preferably of plastic material, on the opposite side of the electronics module 10 relative to the second substrate 21. In addition, optionally, the method may comprise the at least one electronics component being a segment display, such as a 7-segment, 8-segment, or 16-segment display, and wherein the third substrate 31 may be attached to a surface of the segment display being on the opposite side of the display than the circuit board 11.

In various embodiments, the third substrate 31 may be attached to the first surface of the circuit board 11 and/or the at least one electronics component 12, such as the segment display, by third adhesive, such as transparent adhesive or transparent adhesive film or transparent adhesive tape, or non-transparent ones.

In various embodiments, the method may comprise removing a portion of the second substrate 21 to expose the circuit board 11 for arranging the at least one electronics component 12 on the exposed portion of the second surface.

In some embodiments, the method may comprise providing the circuit board 11 as comprising a cavity 19, or producing the cavity 19, on the first surface, the method comprising removing a portion of the third substrate 31 to expose the cavity 19 for arranging one or several electronics components 12, such as a passive infrared sensor, into the cavity 19. In addition, optionally, the method may comprise attaching a second circuit board 11C to the third substrate 31 on the side facing or to be facing the electronics module 10, wherein the second circuit board 11C comprises a through-hole, and, further optionally, removing a portion of the third substrate 31 to expose the through-hole for arranging one or several electronics components 12, such as a passive infrared sensor, to the cavity 19 defined by the through-hole and the circuit board 11.

As described hereinbefore, the method may, preferably, comprise molding, preferably injection molding, material onto a side of the second substrate 21 having the electronics module 10 and at least partly embedding the electronics module 10 under the molding material, such as between the molding material and the second substrate 21.

The method may also comprise, in some embodiments, providing the at least one electronics component 12 including one or more capacitive sensing elements, such as electrodes. Furthermore, the electronics module 10 may comprise a ground layer on the opposite side thereof relative to the one or more capacitive sensing elements.

In various embodiments, the method may comprise arranging a protective ring 6 onto the circuit board 11 and around the at least one electronics component 12. The protective ring 6 may optionally comprise a cover 8 on the opposite side relative to the circuit board 11. Thus, the cavity 19 may be formed therewithin.

In some embodiments, the circuit board 11 may comprises an antenna element, such as a printed antenna or a ceramic antenna, such as on a surface thereof. Alternatively or in addition, the method may comprise providing potting material into a space, that is the cavity 19, defined by the protective ring 6 and the circuit board 11, and optionally the cover 8.

In various embodiments, the electronics module 10 may further comprise an electrical energy storage, such as a battery. The electrical energy storage may be arranged onto a surface of the circuit board 11 or, alternatively, onto a surface of the cover 8, if any. In some embodiments, the method may further comprise arranging a gas vent through the circuit board 11 and the second substrate 21.

In some embodiments, the method may comprise arranging a gas sensor onto the circuit board 11, and providing a gas vent 33 in fluid communication with the gas sensor by removing a portion of the third substrate 31.

In an embodiment, the method may comprise arranging an audio device on the circuit board 11. Alternatively, the method may comprise arranging a haptic actuator like linear resonance actuator (LRA) or eccentric resonance motor (ERM).

In some embodiments, the method may comprise arranging a display to a space left by the removed portion of the third substrate 31.

Furthermore, the first and second circuitry 13, 23 may comprise electronics components selected from the group consisting of: a microcontroller, an integrated circuit, a transistor, a resistor, a capacitor, an inductor, a diode, a photodiode, a light-emitting diode, a semiconductor switch, electromechanical component, electro-optical component, radiation-emitting component, light-emitting component, LED (light-emitting diode), OLED (organic LED), side-shooting LED or other light source, top-shooting LED or other light source, bottom-shooting LED or other light source, radiation detecting component, light-detecting or light-sensitive component, photodiode, phototransistor, photovoltaic device, sensor, micromechanical component, switch, touch switch, touch panel, proximity switch, touch sensor, atmospheric sensor, temperature sensor, pressure sensor, moisture sensor, gas sensor, proximity sensor, capacitive switch, capacitive sensor, projected capacitive sensor or switch, single-electrode capacitive switch or sensor, capacitive button, multi-electrode capacitive switch or sensor, self-capacitance sensor, mutual capacitive sensor, inductive sensor, sensor electrode, micromechanical component, UI element, user input element, vibration element, sound producing element, communication element, transmitter, receiver, transceiver, antenna, infrared (IR) receiver or transmitter, wireless communication element, wireless tag, radio tag, tag reader, data processing element, microprocessor, microcontroller, digital signal processor, signal processor, programmable logic chip, ASIC (application-specific integrated circuit), data storage element, and electronic sub-assembly.

In various embodiments, electrically conductive elements of circuitries, such as conductive traces, conductors, pads, etc., may include at least one material selected from the group consisting of: conductive ink, conductive nanoparticle ink, copper, steel, iron, tin, aluminium, silver, gold, platinum, conductive adhesive, carbon fibre, alloy, silver alloy, zinc, brass, titanium, solder, and any component thereof. The used conductive materials may be optically opaque, translucent and/or transparent at desired wavelengths, such as at least portion of visible light, so as to mask or let the radiation such as visible light to be reflected therefrom, absorbed therein or let through, for instance.

Typically, ready-made components including electronic components such as various SMDs may be attached to the contact areas on the substrate(s) e.g. by solder and/or adhesives. For example, light source(s) (e.g. LEDs) of selected technology and pack-aging may be provided here as well as e.g. different elements of control electronics, communication, sensing, connecting (e.g. connectors), hosting (circuit board(s), carrier(s), etc.) and/or power provision (e.g. battery) depending on the embodiment. A suitable pick-and-place or other mounting device may be utilized for the purpose, for instance. Alternatively or additionally, printed electronics technology may be applied to actually manufacture at least part of the components, such as OLEDs, directly onto the substrates(s), or specifically the film(s) or sheet(s).

In various embodiments, possible additional layers or generally features, may be added into the electronics assembly 100 by molding, lamination or suitable coating (e.g. deposition) procedure not forgetting other possible positioning or fixing techniques. The layers may be of protective, indicative and/or aesthetic value (graphics, colors, figures, text, numeric data, etc.) and contain e.g. textile, leather or rubber materials instead of or in addition to further plastics. Additional elements such as electronics, modules, module internals or parts, and/or optics may be installed and fixed e.g. at the outer surface(s) of the structure, such as the exterior surface of an included film or a molded layer depending on the embodiment. Necessary material shaping/cutting may take place. For example, a diffuser may be produced from locally lasering light-guide material. If provided with a connector, the connector of the multilayer structure may be connected to a desired external connecting element such as an external connector of an external device, system or structure, e.g. a host device. For example, these two connectors may together form a plug-and-socket type connection and interface. The multilayer structure may also be generally positioned and attached herein to a larger ensemble such as an electronic device such as a personal communications device, computer, household apparatus, industrial device, or e.g. a vehicle in embodiments wherein the multilayer structure establishes a part of vehicle exterior or interior, such as a dashboard.

The scope of the present invention is determined by the attached claims together with the equivalents thereof. A person skilled in the art will appreciate the fact that the dis-closed embodiments were constructed for illustrative purposes only, and other arrangements applying many of the above principles could be readily prepared to best suit each potential use scenario.

The invention claimed is:

1. An electronics assembly, comprising:
   a second substrate, said second substrate being a formable film or sheet, preferably of plastic material, comprising a second connection portion connected to a second circuitry printed on a surface of the second substrate,
   an electronics module attached to the second substrate, wherein the electronics module comprises:
   a first circuitry on a first surface at a first side of a circuit board,
   at least one electronics component on the circuit board and in electrical connection with the first circuitry, wherein a conformal coating embeds the at least one electronics component on the first surface, and
   at least one first connection portion on the first surface and/or an adjacent side surface at a peripheral portion of the circuit board, wherein the at least one first connection portion is at least one of electrically connected to or is comprised in the first circuitry;
   wherein a second surface of the circuit board, being on the opposite second side than the first surface, faces the second substrate;
   electrically conductive joint material, being one selected from the group consisting of solder material, conductive adhesive, conductive ink, conductive tape, arranged onto the first and the second connection portions to extend between the first and the second connection portions to electrically connect the electronics module to the second circuitry via the electrically conductive joint material;
   a molded material layer embedding the electronics module; and
   a third substrate on the opposite side of the electronics module relative to the second substrate, wherein the electronics module is attached to the third substrate by a third, electronically non-conductive, adhesive.

2. The electronics assembly of claim 1, wherein the electronics module is attached to the second substrate by a second, electronically non-conductive, adhesive.

* * * * *